US007646661B2

(12) United States Patent
Koga et al.

(10) Patent No.: US 7,646,661 B2
(45) Date of Patent: Jan. 12, 2010

(54) SELF-REFRESH CONTROL CIRCUIT FOR DETECTING CURRENT FLOWING FROM CURRENT GENERATOR AND SEMICONDUCTOR DEVICE INCLUDING SAME

(75) Inventors: Hiroki Koga, Kanagawa (JP); Kazutaka Taniguchi, Kanagawa (JP)

(73) Assignee: NEC Electronics Corporation, Kawasaki, Kanagawa (JP)

( * ) Notice: Subject to any disclaimer, the term of this patent is extended or adjusted under 35 U.S.C. 154(b) by 147 days.

(21) Appl. No.: 12/068,441

(22) Filed: Feb. 6, 2008

(65) Prior Publication Data

US 2008/0212380 A1 Sep. 4, 2008

(30) Foreign Application Priority Data

Mar. 1, 2007 (JP) ............................. 2007-052093

(51) Int. Cl.
*G11C 7/00* (2006.01)
(52) U.S. Cl. .................. 365/222; 365/189.07; 365/191; 365/201; 365/211
(58) Field of Classification Search .................. 365/222, 365/189.07, 191, 201, 211
See application file for complete search history.

(56) References Cited

U.S. PATENT DOCUMENTS

| 5,499,213 | A | * | 3/1996 | Niimi et al. | ................. | 365/222 |
| 6,618,310 | B2 | * | 9/2003 | Higashiho et al. | ........... | 365/222 |
| 7,038,967 | B2 | * | 5/2006 | Uchikoba et al. | ........... | 365/222 |

FOREIGN PATENT DOCUMENTS

| JP | 2006-31830 | 2/2006 |
| JP | 2006-31860 | 2/2006 |

* cited by examiner

*Primary Examiner*—Pho M. Luu
(74) *Attorney, Agent, or Firm*—McGinn IP Law Group, PLLC

(57) ABSTRACT

A self-refresh control circuit includes a first constant current generating circuit that generates a constant current to change depending on the temperature, a second constant current generating circuit to generate a constant current not depending on the temperature, a current-cycle converting circuit selectively connected to the first constant current generating circuit and the second constant current generating circuit and converting the constant currents inputted from the first constant current generating circuit and the second constant current generating circuit into a test refresh cycle used for setting the refresh cycle.

20 Claims, 20 Drawing Sheets

Fig. 19
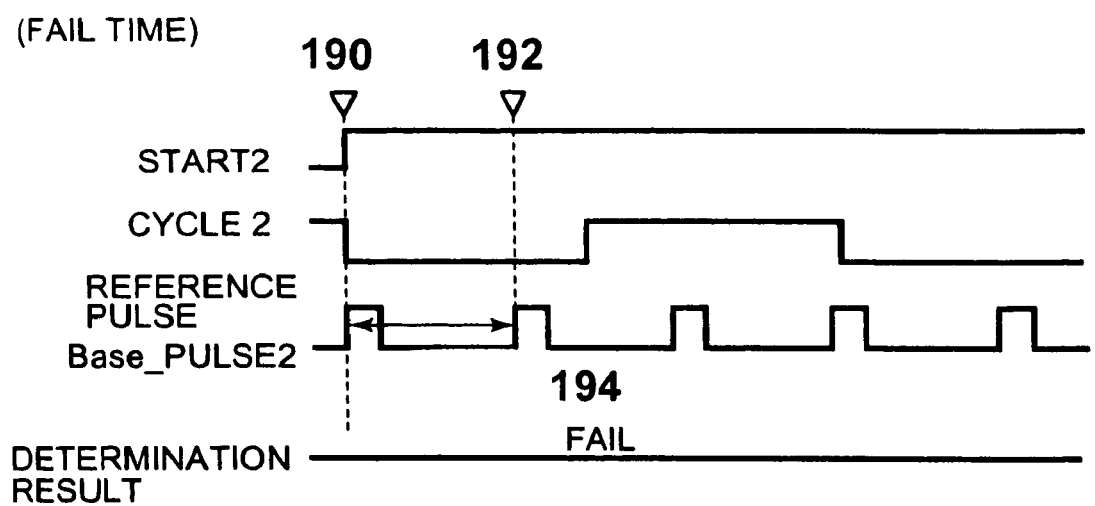
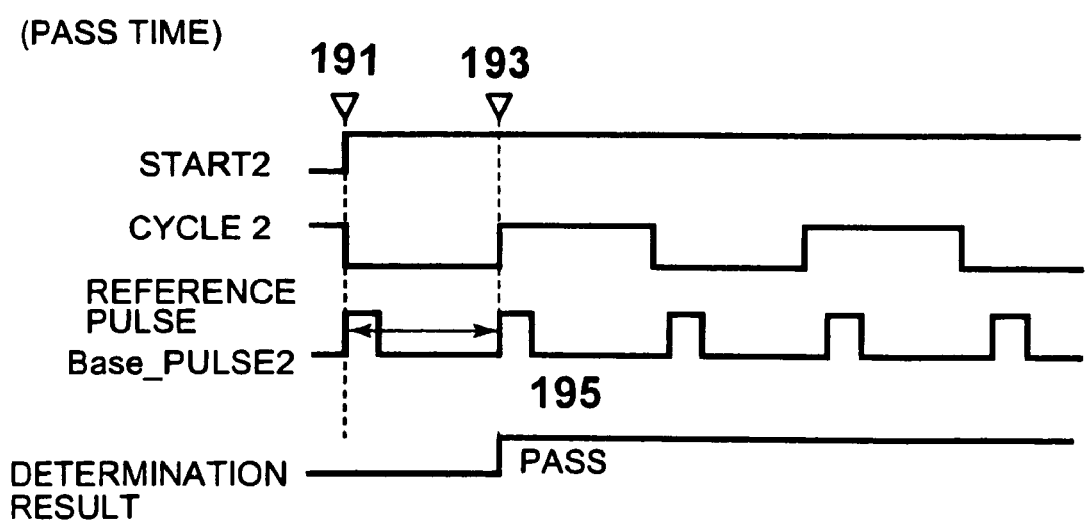

Fig. 20
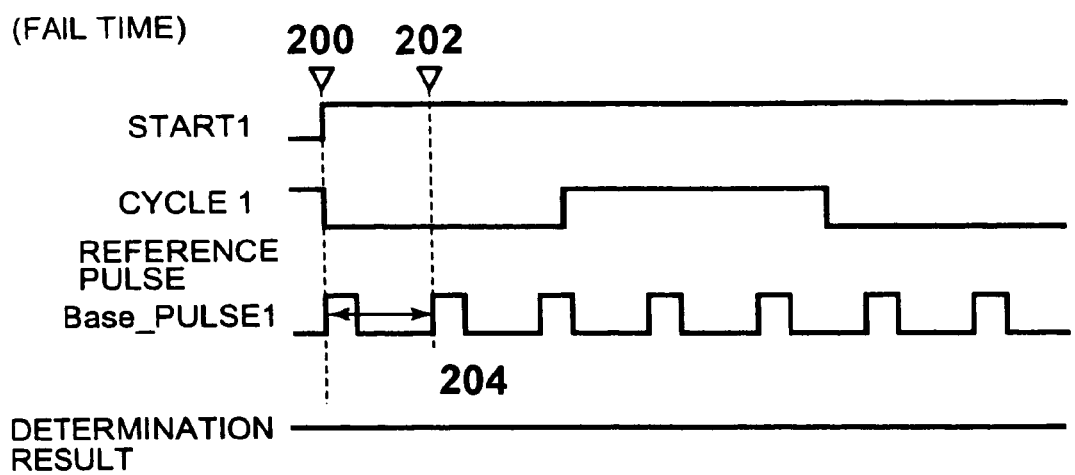
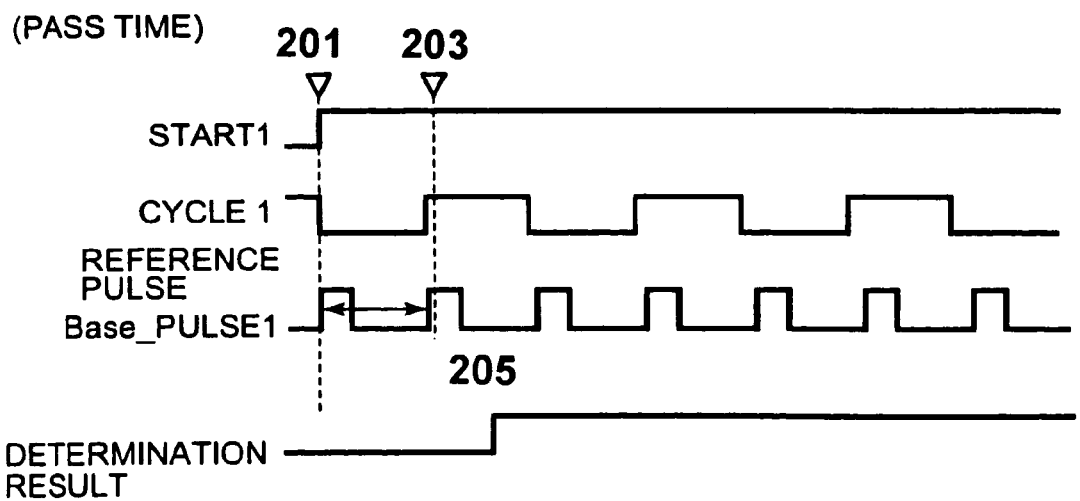

US 7,646,661 B2

SELF-REFRESH CONTROL CIRCUIT FOR DETECTING CURRENT FLOWING FROM CURRENT GENERATOR AND SEMICONDUCTOR DEVICE INCLUDING SAME

BACKGROUND OF THE INVENTION

1. Technical Field

The present invention relates to a self-refresh control circuit and a semiconductor device having this circuit.

2. Related Art

In the semiconductor device having a DRAM (Dynamic Random Access Memory) cell, to hold data stored in a DRAM cell, a refresh operation that holds an electric charge accumulated every constant cycle is required to be performed. Hence, the semiconductor device is provided with a self-refresh control circuit so as to perform a refresh operation of the DRAM cell every constant cycle without having an access to the semiconductor apparatus from the outside.

A cause of data disappearance of the DRAM cell is mainly an electric charge disappearance due to leak current having temperature dependency of the device. Incidentally, in the low to the normal temperature state of the device, an amount of disappearance of the electric charge is small, and in the high temperature state, an amount of disappearance of the electric charge is large. Hence, in the low to the normal temperature state of the device, even when the cycle of performing the refresh operation is long, the data can be held, while in a high temperature state, the electric charge easily disappears, and therefore, the cycle of the refresh operation is required to be set short.

Patent Document 1, which is Japanese Patent Laid-Open No. 2006-031830, shows a self-refresh control circuit that generates refresh cycles different for the normal temperature and the high temperature. FIG. 22 is a functional block diagram showing the configuration of a conventional self-refresh control circuit disclosed in Patent Document 1. This refresh control circuit is configured to include a constant current generating circuit 220, a constant current generating circuit 221, a bias voltage adjusting circuit 222, a ring oscillator 223, a counter circuit 224, and a refresh row-address generating circuit 225. The constant current generating circuit 220 hardly depends upon the temperature of the device, and generates the constant voltage BIAST. The constant current generating circuit 221 has temperature dependency, and generates a constant voltage BIASN according to the temperature.

The bias voltage adjusting circuit 222 generates a bias voltage BIASS according to bias voltages BIAST and BIASN, and outputs the bias voltage BIASS to a ring oscillator 223. The ring oscillator 223 generates a pulse signal PHYO whose cycle changes according to the inputted bias voltage BIASS. The counter circuit 224 counts the pulse signal PHYO, and outputs an activation signal PHYS when the predetermined number of times is exceeded. The refresh row-address generating circuit 225, according to this activation signal PHYS, switches over the row-address that performs the refresh operation. In this manner, by providing the constant current generating circuit 220 small in temperature dependency and the constant current generating circuit 221 large in temperature dependency, the refresh cycle having cycles different for the normal temperature and the high temperature can be provided.

FIG. 23 is a circuit diagram showing the configuration of the bias voltage adjusting circuit 222 possessed by a self-refresh control circuit according to Patent Document 1. The bias voltage adjusting circuit 222 is configured to include P-channel transistors P7 and P8 and N-channel transistors N8 to N10. The P-channel transistor P7 has its source connected to a power source VDD and its drain and gate connected to a node ND6. The P-channel transistor P8 has its source connected to the power source VDD and its drain connected to a node ND7, and its gate connected to the node ND6. The N-channel transistor N8 has its source grounded, its drain connected to the node ND6, and its gate inputted with the bias voltage BIAST. The N-channel transistor N9 has its source grounded, its drain connected to the node ND6, and its gate inputted with the bias voltage BIASN. The N-channel transistor N10 has its source grounded, its drain and gate connected to the node ND7. In the bias voltage adjusting circuit 222, the voltage of the node ND7 is outputted as the bias voltage BIASS.

Patent Document 2, which is Japanese Patent Laid-Open No. 2006-031860, discloses a self-refresh control circuit that changes a refresh cycle in stages according to the temperature. FIG. 24 is a functional block diagram showing a configuration of a conventional self-refresh control circuit shown in Patent Document 2. This self-refresh control circuit is configured to include a band gap type reference potential generating circuit 231, a current control bias circuit 232, a comparison voltage generating circuit 233, a ring oscillator 234, a frequency divider circuit 235, a frequency selecting circuit 236, and a temperature detector 237. The band gap type reference potential generating circuit 231, the current control bias circuit 232, the comparison voltage generating circuit 233, and the ring oscillator 234 are configured to generate a pulse signal having a cycle according to the temperature of the device. The frequency divider circuit 235 inputs this generated pulse signal, and outputs signals of plural divided frequencies. The frequency selecting circuit 236 outputs refresh reference signals REFRQ corresponding to the plural pieces of the divided frequencies generated by the frequency divider circuit 235 according to the signal inputted from the temperature detector 237. In this manner, by selecting the signals of the divided frequencies according to the temperature of the device, the refresh cycle can be changed in steps according to the temperature.

FIG. 25 is a circuit diagram showing a part of the configuration of the current control bias circuit 232 of the self-refresh control circuit disclosed in Patent Document 2. The current control bias circuit 232 is configured to include the P-channel transistors QP07 to 10 and the N-channel transistors QN05 to 09. The P-channel transistor QP07 has its source connected to a current source ISO1, and its drain connected to a node NO1, and its gate inputted with a control voltage VBE. The P-channel transistor QPO8 has its source connected to the current source ISO1, its drain connected to a node NO2, and its gate inputted with a control voltage VRTRO. The N-channel transistor QN05 has its source grounded, and its drain connected to the node NO1, and its gate connected to the node NO2. The N-channel transistor QN06 has its source grounded, and its drain and gate connected to the node NO2. The N-channel transistor QN07 has its source grounded, and its drain and gate connected to the node NO2. The N-channel transistor QN08 has its source grounded, and its drain connected to the current source ISO2, and its gate connected to the node NO2. The P-channel transistor QN09 has its source connected to the power source VDD, and its drain connected to the drain of the N-channel transistor QN08, and its gate connected to the current source ISO2. The P-channel transistor QP10 has its source connected to the power source VDD, and its drain connected to the drain of the N-channel transistor QN09, and its gate connected to a control voltage OSCBP. The N-channel transistor QN09 has its source grounded, and its drain connected to the drain of the P-channel transistor QP10, and its gate connected to a control voltage OSCBN.

In the self-refresh control circuit disclosed in Patent Document 1, when the temperature decreases, the bias voltage BIASN is grounded, so that the bias voltage adjusting circuit 222 outputs a constant voltage decided by the bias voltage BIAST. However, in the self-refresh control circuit disclosed in Patent Document 1, no means is provided for measuring and adjusting the bias voltage BIAST only, and the fluctuation of the bias voltage BIAST due to the fluctuation of the process and the like cannot be compensated. As a result, the bias voltage BIAST at the normal temperature cannot be set to a desired value, and to perform a guarantee of proper operation, the refresh cycle must be set short in consideration of the fluctuation of the process. Hence, a problem arises that the standby current at the normal temperature is increased by an amount corresponding to shortening of the refresh cycle.

Further, in the self-refresh control circuit disclosed in Patent Document 2, in the circuit diagram shown in FIG. 25, when the temperature decreases and a potential of the node NO1 of the current control bias circuit 232 decreases so that the N-channel transistor QN08 is cut off, the potentials of the control voltages QSCBP and QSCBN output a constant voltage decided by the current source ISO2. Incidentally, the current source ISO2 is considered to be equivalent to a resistor in a constant bias condition. However, in the self-refresh control circuit disclosed in Patent Document 2, since there is no means available for measuring and adjusting the control voltages QSCBP and QSCBN only, at the normal temperature, when the current source ISO2 does not become a desired resistance due to the fluctuation of the device, a fluctuation occurs in the refresh cycle at the normal temperature. Further, when the detection temperature of the temperature detector 237 does not become a desired value due to the fluctuation of the device, a fluctuation further occurs in the refresh cycle at the normal temperature. Hence, when the refresh cycle is designed to be short in consideration of these fluctuations, a problem arises that the standby current increases at the normal temperature similarly to Patent Document 1.

Usually, the DRAM mounted with the self-refresh control circuit is, for example, mounted on a mobile-phone terminal and the like. Since the mobile-phone terminal is almost used at the normal temperature, the reduction of a consumption power of the standby current at such normal temperature time becomes a key question.

SUMMARY OF THE INVENTION

A self-refresh control circuit according to the present invention includes a first constant current generating circuit that generates a constant current to change depending on the temperature, a second constant current generating circuit that generates a constant current not depending on the temperature, and a current-cycle converting circuit selectively connected to the first constant current generating circuit and the second constant current generating circuit and converting constant currents inputted from the first constant current generating circuit and the second constant current generating circuit into test refresh cycles used for setting refresh cycles.

In this manner, by selectively connecting the first constant current generating circuit that generates a constant current having temperature dependency and the second constant current generating circuit not depending on the temperature, constant currents inputted from the first constant current generating circuit and the second constant current generating circuit can be converted into separate test refresh cycles.

According to the self-refresh control circuit of the present invention, the refresh cycles of the normal temperature and the high temperature can be separately obtained.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 19 shows a timing chart of each signal when the refresh cycle at the normal temperature time is set;

FIG. 20 shows a timing chart of each signal when the refresh cycle at the high temperature time is set;

DETAILED DESCRIPTION OF THE EXEMPLARY EMBODIMENTS

First Embodiment

Figure 1:
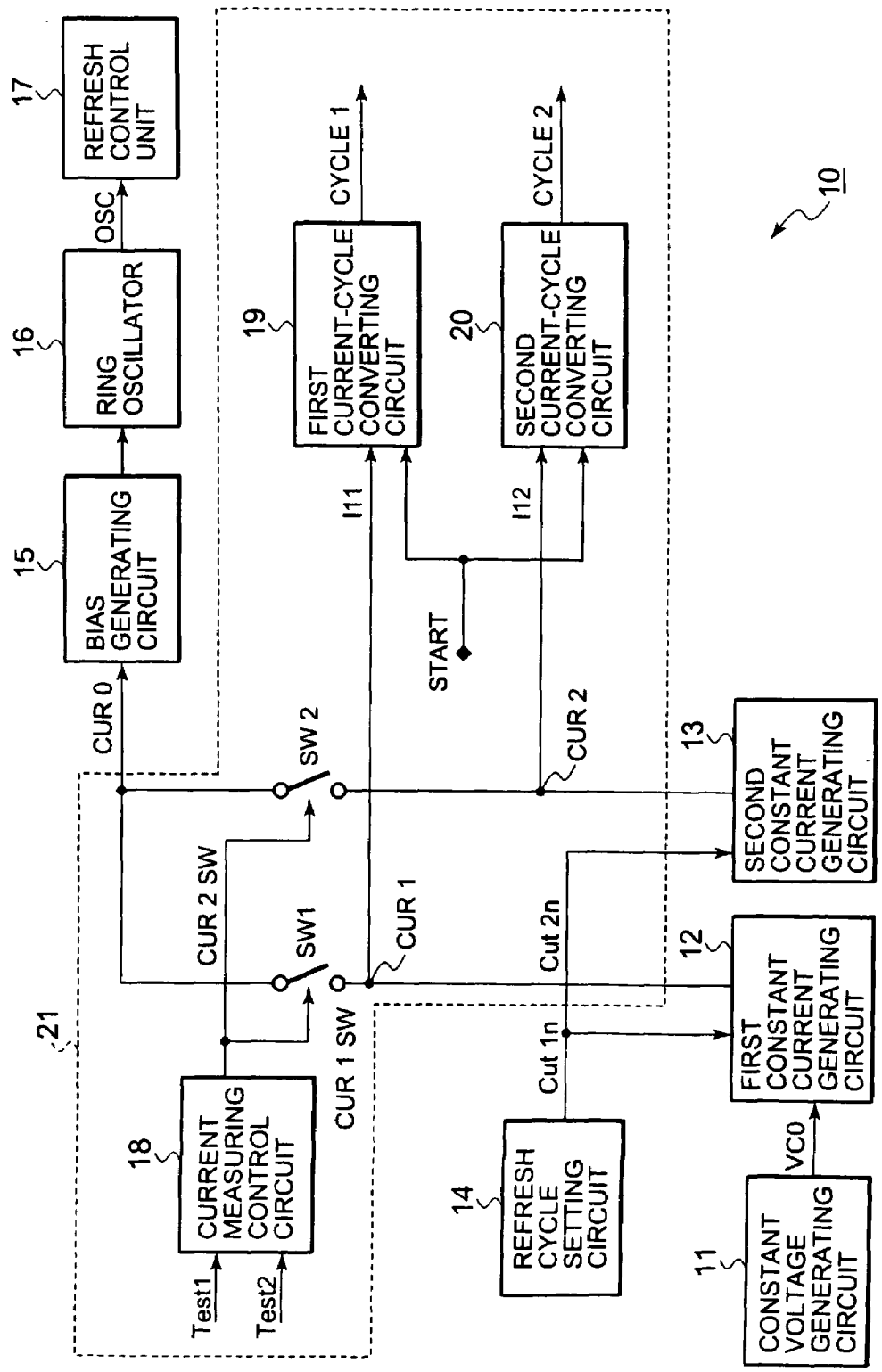
FIG. 1 is a functional block diagram showing one configuration example of a self-refresh control circuit 10 according to a first embodiment of the present invention.

FIG. 1 is a functional block diagram showing one configuration example of a self-refresh control circuit 10 according to a first embodiment of the present invention. The self-refresh control circuit 10 mounted on a device and the like is configured to be connected to DRAM cells (not shown) arranged in rows and columns and to be controlled to cyclically perform the refresh operation so as to hold the data stored in the DRAM cells. The self-refresh control circuit 10 includes a constant voltage generating circuit 11, a first constant current generating circuit 12, a second constant current generating circuit 13, a refresh cycle setting circuit 14, a bias generating circuit 15, a ring oscillator 16, a refresh control unit 17, a current measuring control circuit 18, a first current-cycle converting circuit 19, and a second current-cycle converting circuit 20. Further, the current measuring control circuit 18, the first current-cycle converting circuit 19, and the second current-cycle converting circuit 20 configures a test circuit 21 that generates a test refresh cycle used for setting the refresh cycle.

The constant voltage generating circuit 11 is configured to generate a constant reference voltage VCO serving as a reference and output the reference voltage VCO to the first constant current generating circuit 12. The first constant current generating circuit 12 is configured to input the reference voltage VCO from the constant voltage generating circuit 11 and output a current I11 depending on the temperature of the device to a contact point CUR1. The first constant current generating circuit 12 is configured to generate a heavy current at the high temperature time of the device. The contact point CUR1 is connected to the bias generating circuit 15 through a switch SW1. The second constant current generating circuit 13 is configured to generate a current I12 not depending on the temperature of the device and output the current to a contact point CUR2. The contact point CUR2 is connected to the bias generating circuit 15 through a switch SW2.

The refresh cycle setting circuit 14 is configured to output a control signal Cut1n to the first constant current generating circuit 12 and control a current value of the current I11 generated by the first constant current generating circuit 12. Likewise, the refresh cycle setting circuit 14 is configured to output a control signal Cut2n to the second constant current generating circuit 13 and control a current value of the current 12 generated by the second constant current generating circuit 13.

The bias generating circuit 15 is connected to the contact point CUR1 through a switch SW1, and at the same time, is connected to the contact point CUR2 through a switch SW2. The bias generating circuit 15 is configured to input the current I11 flowing to the contact point CUR1 and the current I12 flowing to the contact point CUR2 and generate a signal to control the operation of the ring oscillator 16. The ring oscillator 16 is configured to generate a pulse signal OSC according to the signal level inputted from the bias generating circuit 15. The refresh control unit 17 is configured to count the pulse signal OSC inputted from the ring oscillator 16 and generate a row-address to refresh according to the pulse signal OSC. In this manner, by switching over the row-address, the refresh operation of the DRAM cell is executed in sequence.

The current measuring control circuit 18 is a control circuit that measures the current values of the current I11 and I12 flowing to the contact points CUR1 and CUR2. The current measuring control circuit 18 is configured to output a control signal CUR1SW that switches over the switch SW1 and a control signal CUR2SW that switches over the switch SW2 according to the inputted control signals Test1 and Test2. The first current-cycle converting circuit 19 is configured to be connected to the contact point CUR1 only and convert the current value of the current I11 flowing to the contact point CUR1 into an output signal CYCLE1 having a cycle, and output the same. The second current-cycle converting circuit 20 is configured to be connected to the contact point CUR2 only and convert the current value of the current I12 flowing to the contact point CUR2 into an output signal CYCLE2 having a cycle, and output the same.

Figure 2:
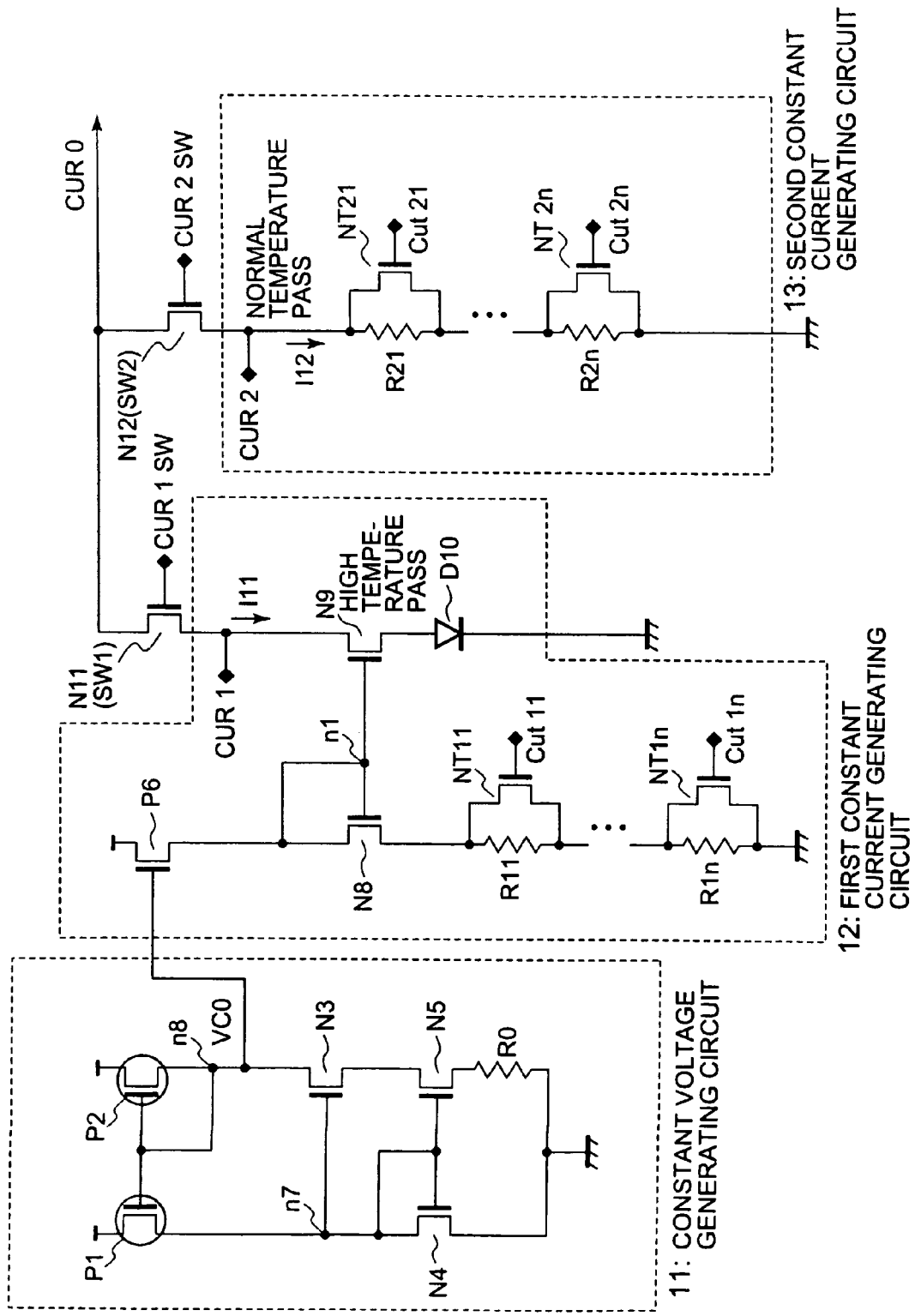
FIG. 2 is a circuit diagram showing one each specific configuration example of a constant voltage generating circuit 11, a first constant current generating circuit 12 and a second constant current generating circuit 13.

FIG. 2 is a circuit diagram showing a specific configuration of the constant voltage generating circuit 11, the first constant current generating circuit 12, and the second constant current generating circuit 13.

The constant voltage generating circuit 11, for example, can be configured by P-channel transistors P1 and P2, N-channel transistors N3 to N5, and a resistor RO. The P-channel transistor P1 has its source connected to a power source voltage, and its drain connected to a node n7, and its gate connected to a node n8. The P-channel transistor P2 has its source connected to the power source voltage, and its drain and gate connected to a node n8. The N-channel transistor N3 has its source connected to the drain of the N-channel transistor N5, and its drain connected to the node n8, and its gate connected to the node n7. The N-channel transistor N4 has its source grounded, and its drain and gate connector the node n7. The N-channel transistor N5 has its source grounded through the resistor RO, and its drain connected to the source of the N-channel transistor N3, and its gain connected to the node n7. From the constant voltage generating circuit 11 configured in this manner, the voltage of the node n8 is outputted as the reference voltage VCO.

The first constant current generating circuit 12 includes a P-channel transistor P6, N-channel transistors N8 and N9, and NT11 to NT1n, resistors R11 to R1n, and a diode D10. The P-channel transistor P6 has its source connected to the power source, and its drain connected to a node n1, and its gate inputted with the reference voltage VCO. The N-channel transistor N8 has its source grounded through a plurality of resistors R11 to R1n connected in series with the source, and its drain and gate connected to the node n1. The resistors R11 to R1n are connected in parallel with the N-channel transistor NT11 to NT1n, respectively. The gates of the N-channel transistors NT11 to NT1n are inputted with control signals Cut11 to Cut1n, respectively. That is, the control signals Cut11 to Cut1n on-off control the N-channel transistor NT11 to NT1n. The N-channel transistor N9 has its source connected to an anode of the diode D10, and its drain connected to the contact point CUR1, and its gate connected to the node n1. Incidentally, the contact point CUR1 is connected to the source of the N-channel transistor N11 configuring the switch SW1 described above.

In the first constant current generating circuit 12 configured in this manner, a threshold value of the diode D10 changes by the ambient temperature so that the magnitude of the current I11 flowing to the drain of the N-channel transistor N9 changes. That is, when the ambient temperature is low, the threshold value of the diode D10 is large, and the anode potential of the diode D10 is kept high. Hence, the potential difference between the gate and source of the N-channel transistor N9 is reduced, and either the N-channel transistor N9 is applied with a very small current I11 or the N-channel transistor N9 is turned off and no current is applied. On the other hand, when the ambient temperature is high, the threshold value of the diode D10 is small, and the node potential of the diode D10 is low. As a result, the potential difference between the gate and source of the N-channel transistor N9 is increased, and the N-channel transistor N9 is applied with a large current I11. The current I11 flowing to the contact point CUR1 in this manner is small or does not flow when the ambient temperature is low, and when the ambient temperature is high, the current I11 becomes large. Thus, the first constant current generating circuit 12 has a temperature dependency.

As shown in FIG. 2, the second constant current generating circuit 13 is configured to include resistors R21 to 2n and N-channel transistors NT21 to NT2n. The contact point CUR2 is grounded through these resistors R21 to R2n connected in series. The resistors R2 to 2n are connected in parallel with the N-channel transistors NT21 to NT2n, respectively. The gates of the N-channel transistors NT21 to NT2n are inputted with control signals Cut21 to Cut2n, respectively. That is, the control signals Cut21 to Cut2n on-off control the N-channel transistors NT21 to NT2n. Incidentally, the contact point CUR2 is connected to the source of the N-channel transistor N12 configuring the switch SW2. By such configuration, the second constant current generating circuit 13 can let flow a constant current not depending on the ambient temperature to the contact point CUR2.

Figure 3:
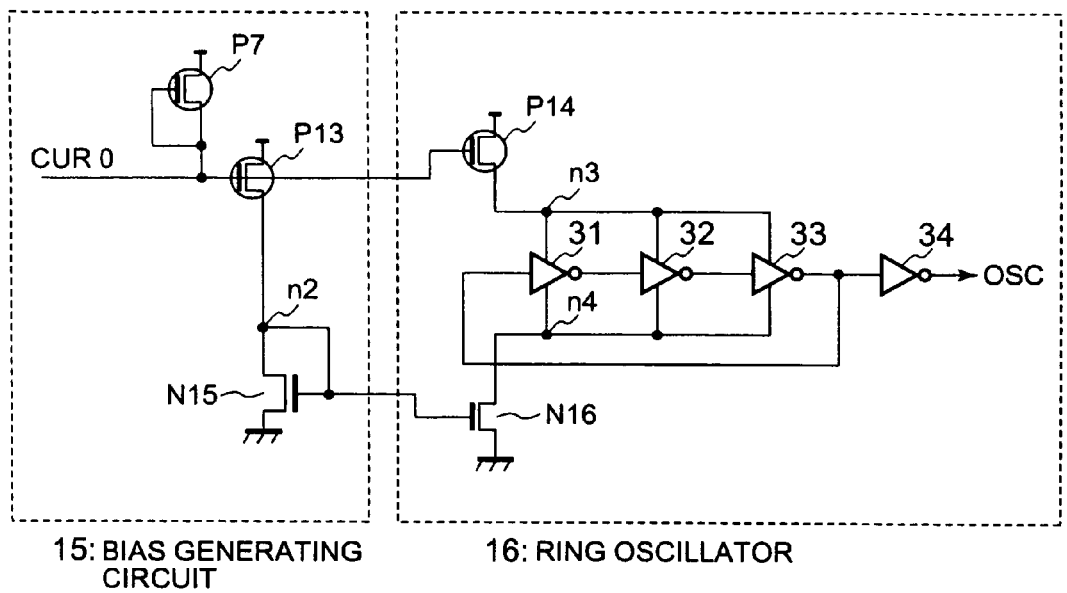
FIG. 3 is a circuit diagram showing one each configuration example of a bias generating circuit 15 and a ring oscillator 16.

FIG. 3 is a circuit diagram showing one each configuration example of the bias generating circuit 15 and the ring oscillator 16. The bias generating circuit 15 can be configured by using the P-channel transistors P7 and P13 and the N-channel transistor 15. The P-channel transistor P7 has its source connected to the power source, and its drain and gate connected to a contact point CUR0. The P-channel transistor P13 has its source connected to the power source, and its drain connected to the node n2, and its gate connected to the contact point CUR0. The N-channel transistor N15 has its source grounded, and its drain and gate connected to the node n2.

The ring oscillator 16 is configured to include a P-channel transistor P14, a N-channel transistor N16, and inverters 31 to 34. The P-channel transistor P14 has its source connected to the power source, and its drain connected to a node n3, and its gate connected to the contact point CUR0. The N-channel transistor N16 has its source grounded, and its drain connected to a node n4, and its gate connected to the node n2. The inverters 31 to 33 are connected in series, and the output of the inverter 33 is inputted to the inverter 31, and the inverters 31 to 33 are connected ring-shaped. The inverters 31 to 33 are connected to the node n3, and are connected to the power source through the P-channel transistor P14. Further, the inverters 31 to 33 are connected to the node n4, and are grounded through the N-channel transistor N16. An inverter 34 is configured to be connected to the inverter 33 and reverse signals generated by the inverters 31 to 33 connected ring shaped and output a pulse signal OSC.

Figure 4:
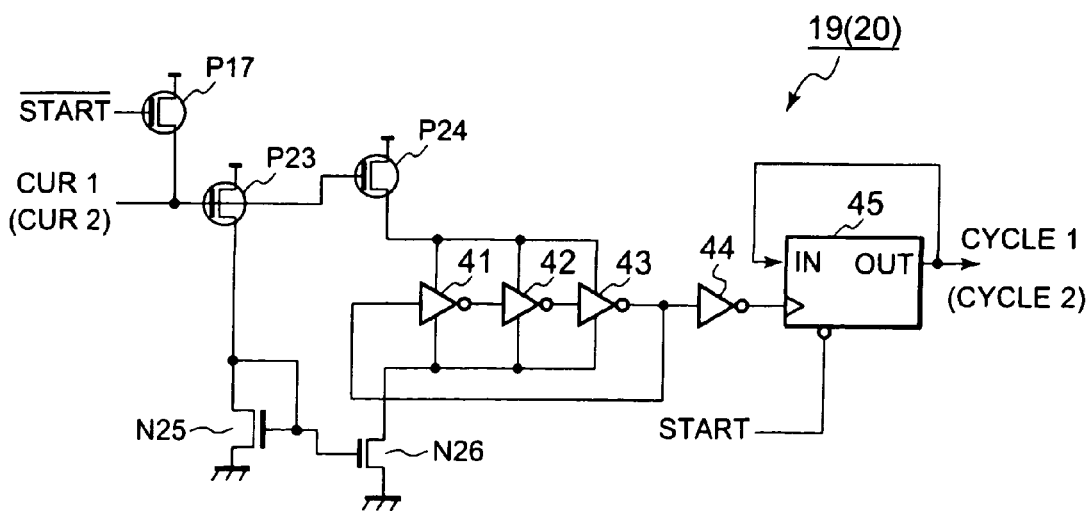
FIG. 4 is a circuit diagram showing one each configuration example of a first current-cycle converting circuit 19 and a second current-cycle converting circuit 20.

FIG. 4 is a circuit diagram showing a configuration example of the first current-cycle converting circuit 19 and the second current-cycle converting circuit 20. The first current-cycle converting circuit 19 and the second current-cycle converting circuit 20 have the same configuration except for the contact points CUR1 and CUR2 to be connected. Hereinafter, the first current-cycle converting circuit 19 will be described as an example. As shown in FIG. 4, the first current-cycle converting circuit 19 has approximately the same configuration as the bias generating circuit 15 and the ring oscillator 16 shown in FIG. 3. The first current-cycle converting circuit 19 is configured to include P-channel transistors P17, P23, and P24, N-channel transistors N25 and N26, Inverters 41 to 44, and a flip-flop circuit 45.

The P-channel transistors P17, P23, and P24, the N-channel transistors N25 and N26, and the inverters 41 to 44 are equivalent to the P-channel transistors P7, P13, and P14, the N-channel transistors N15 and N16, and the inverters 31 to 34 of the ring oscillator 16 shown in FIG. 3, respectively. Since the connecting relationship is the same as FIG. 3, the description thereof will be omitted. Further, the first current-cycle converting circuit 19 has a flip-flop 45. The flip-flop circuit 45 inputs the pulse signals generated by the inverters 41 to 43 as clock signals through the inverter 44. Further, the flip-flop circuit 45 is configured to input the generated output signal CYCLE1 (CYCLE2 in the case of the second current-cycle converting circuit 20). The flip-flop circuit 45 is inputted with a control signal START, and is controlled to be in an activated/non-activated state according to this control signal START.

In the first current-cycle converting circuit 19 configured in this manner, the gate of the P-channel transistor P17 is inputted with an inverse logic of the control signal START. At the time of measuring the current of the contact point CUR1, the control signal START inputted to the first current-cycle converting circuit 19 is set to a H-level. As a result, the P-channel transistor P17 is turned on, and the bias current is applied. Further, the flip-flop circuit 45 outputs the H-level as an output signal CYCLE1 so long as the control signal START is at an L-level, and allows the output signal CYCLE1 to perform a cyclic operation as long as the control signal START is at the H-level.

Figure 5:
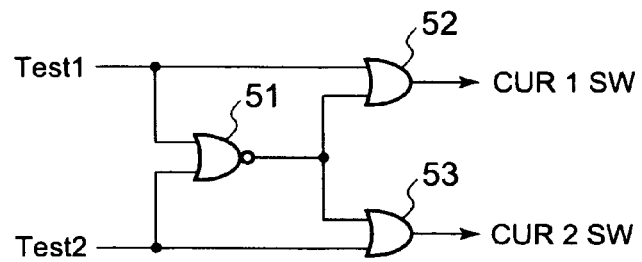
FIG. 5 is a circuit diagram showing one configuration example of a current measuring control circuit 18.

FIG. 5 is a circuit diagram showing one configuration example of the current measuring control circuit 18. The current measuring control circuit 18 is configured to include a NOR circuit 51 and OR circuits 52 and 53. The NOR circuit 51 is inputted with a control signal Test1 at one side and inputted with a control signal Test2 at the other side. The OR circuit 52 is configured to be inputted with the control signal Test1 at one side and inputted with the output of the NOR circuit 51 at the other side so as to output a control signal CUR1SW. The control signal CUR1SW performs an on/off control of the switch SW1 shown in FIG. 1. The OR circuit 53 is configured to be inputted with the control signal Test2 at one side and inputted with the output of the NOR circuit 51 at the other side so as to output a control signal CUR2SW. The control signal CUR2SW performs an on/off control of the switch SW2 shown in FIG. 1.

In the current measuring control circuit 18 configured in this manner, when any of the control signals Test1 and Test2 is, for example, at the L-level, any of the control signals CUR1SW and CUR2SW to be outputted is at the H-level. Further, when the control signal Test1 is at the H-level, and the control signal Test2 is at the L-level, the control signal CUR1SW is set to the H-level, and the control signal CUR2SW is set to the L-level.

Figure 6:
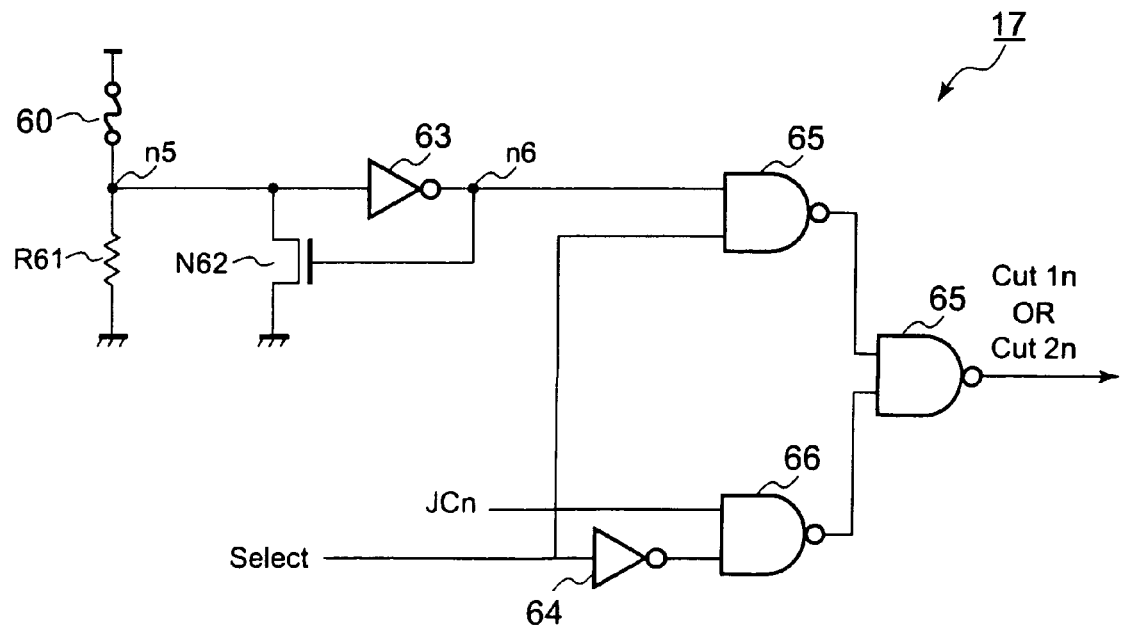
FIG. 6 is a circuit diagram showing one configuration example of a refresh cycle setting circuit 14.

FIG. 6 is a circuit diagram showing one configuration example of the refresh cycle setting circuit 14. The refresh cycle setting circuit 14 is configured to include a fuse 60, a resistor circuit R61, an N-channel transistor N62, inverters 63 and 64, and NAND circuits 65 to 67. The fuse 60 has one end connected to the power source and the other connected to a node n5. The resistor circuit R61 has one end connected to the node n5 and the other end grounded. The N-channel transistor N62 has the source grounded, and its drain connected to the node n5, and its gate connected to a node n6. The inverter 63 has one end connected to the node n5 and the other end connected to the node n 6. That is, the N-channel transistor N62 and the inverter 63 configure a latch circuit. The NAND circuit 65 has one side connected to the node 6 and the other side inputted with a control signal Select. The NAND circuit 66 has one side inputted with the control signal Select through the inverter 64, and the other side inputted with a control signal JCn. The NAND circuit 67 is configured to be inputted with the output of the NAND circuit 65 at one side, and inputted with the output of the NAND circuit 66 at the other side so as to output a control signal Cut1n (Cut2n). That is, the NAND circuits 65 to 67 configure a selector circuit. Incidentally, the resistor circuit R61 can be also configured by the N-channel transistor whose gate is inputted with the pulse signal of the H-level.

In the refresh cycle setting circuit 14 configured in this manner, when the fuse 60 is shut off, the node n5 is at the L-level. As a result, the latch circuit configured by the N-channel transistor N62 and the inverter 63 outputs the H-level to the node n6. Next, when the NAND circuit 65 is inputted with the control signal Select of the H-level, the output of the NAND circuit 65 is set to the L-level, and the control signal Cut1n (or Cut2n) to be outputted is set to the H-level. On the other hand, when the control signal Select is inputted with the L-level, the control signal Cut1n (or Cut2n) to be outputted is set to the H/L level according to the control signal JCn. Incidentally, when the fuse 60 is not shut off, in case the control signal Select is at the H-level, the control signal Cut1 (or Cut2) to be outputted is set to the H-level, and when the control signal Select is at the L-level, the control signal Cut1 (or Cut2) is set to the H/L level according to the control signal JCn.

In the refresh cycle setting circuit 14 configured in this manner, first, the control signal Select is set to the L-level. The level of the control signal Cut1n (or Cut2n) to be outputted is artificially changed according to the signal level of the control signal JCn, so that the current values of the constant current generating circuits 12 and 13 are changed. In this manner, a state of the control signal Cut1n (or Cut2n) from which a desired current value is obtained is detected. A state of the fuse is switched over, so that the control signal Cut1n (or Cut2n) is set to a desired signal level. As a result, the current values outputted from the constant current generating circuits 12 and 13 can be set to the desired values.

Figure 7:
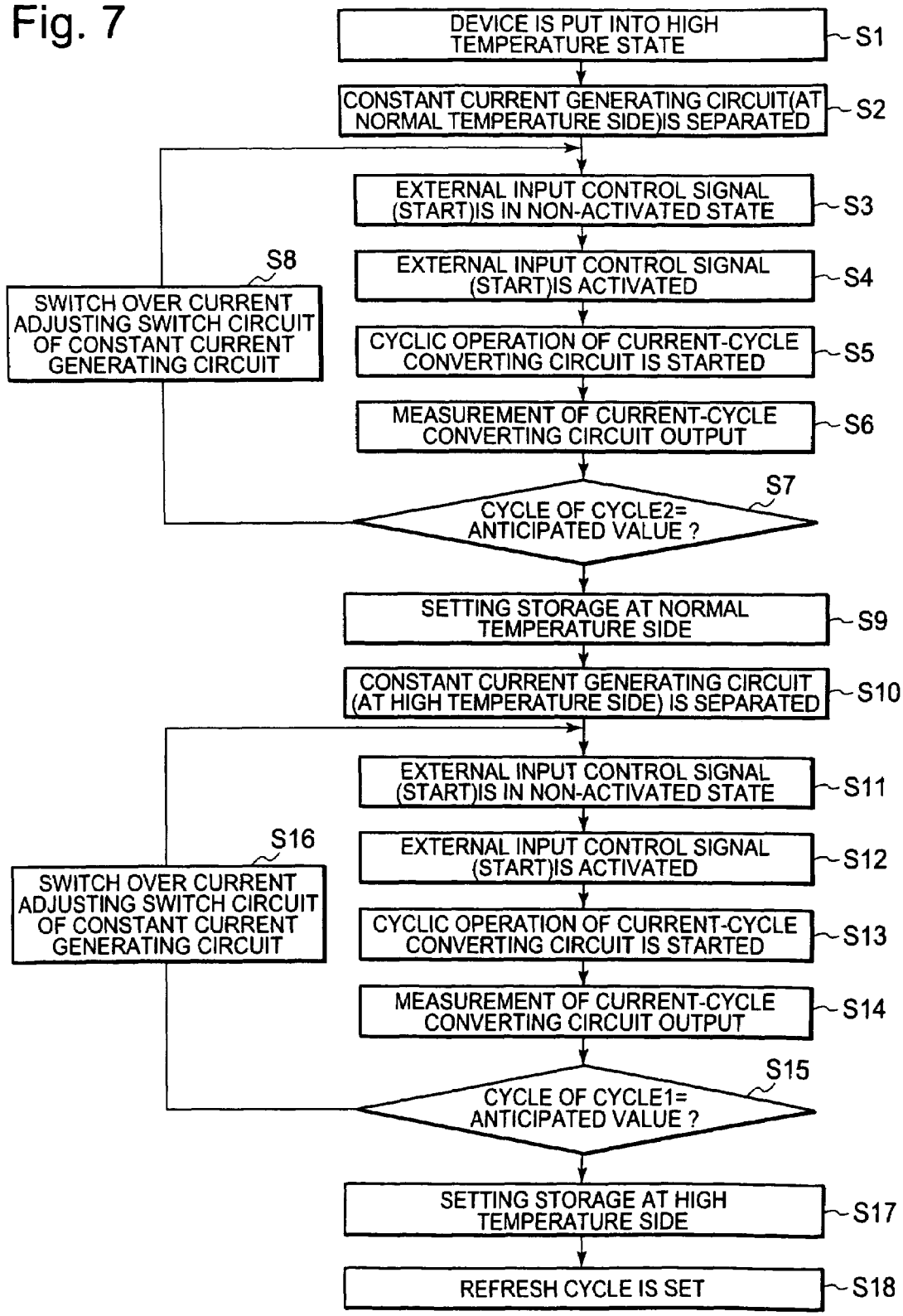
FIG. 7 is a sequence view showing a method for setting the refresh cycle of the self-refresh control circuit 10 according to a fist embodiment.

Next, the operation of the self-refresh control circuit 10 will be described by using FIG. 7. FIG. 7 is a sequence view showing a setting method of the refresh cycle of the self-refresh control circuit 10 according to the first embodiment.

First, the device is set to a high temperature state (S1). Then, the first constant current generating circuit 12 (at the high temperature side) and the second constant current generating circuit (at the normal temperature side) are concurrently put into an activated state, and generate the constant currents I11 and I12, respectively. Incidentally, the N-channel transistors NT11 to NT1n and NT21 to NT2n which are the current adjusting transistors possessed by the first constant current generating circuit 12 and the second constant current generating circuit 13 are all set to be turned off in the initial state. Next, by the current measuring control circuit 18, the N-channel transistor N12 configuring the switch SW2 is turned off, and the second constant current generating circuit 13 (at the normal temperature side) is cut off from the bias generating circuit 15 and the like (S2).

Next, the control signal START inputted to the second current-cycle converting circuit 20 from the outside is set to a non-activated state (L-level) (S3). As a result, the flip-flop circuit 45 possessed by the second current-cycle converting circuit 20 is re-set, and the second current-cycle converting circuit 20 is re-set. Next, the control signal START is set to an activated state (H-level) (S4). As a result, the re-set state of the flip-flop circuit 45 possessed by the second current-cycle converting circuit 20 is released, thereby to put the second current-cycle converting circuit 20 into an activated state. The output signal CYCLE2 of the second current-cycle converting circuit 20 starts the cyclic operation according to the current I12 flowing to the contact point CUR2 (S5).

Figure 8:
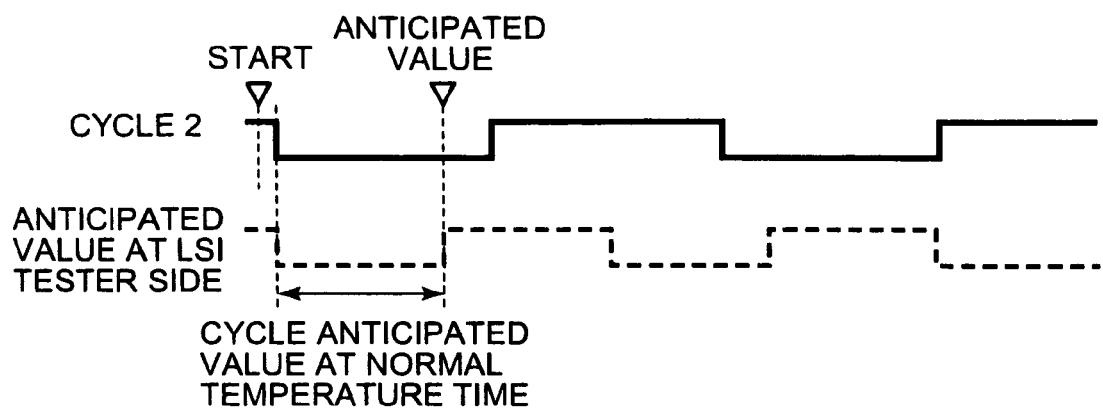
FIG. 8 shows a timing chart of an output signal CYCLE2.

Here, in FIG. 8 is shown a timing chart of the output signal CYLCE2 which is outputted. Incidentally, below the output signal CYCLE2 is indicated an anticipated value of the output signal CYCLE2 at the normal temperature time at the LSI tester side. When the control signal START is set to the H-level, the output signal CYCLE2 changes from the H-level to the L-level, and after that, performs the cyclic operation that changes in potential level at the predetermined cycle. Here, in the rising up of the signal of the anticipated value in the LSI tester, the value of the output signal CYCLE2 is measured (S6). Next, by the LSI tester, the output signal CYCLE2 and the anticipated value are compared, and the determination is made as to whether or not the output signal CYLCE2 satisfies the anticipated value (S7). When the output signal CYCLE2 does not satisfy the anticipated value of the desired range, by the refresh cycle setting circuit 14, the current adjusting switch NT21 to NT2n possessed by the second constant current generating circuit 13 are switched over (S8). That is, at step S8, the values of the control signals Cut21 to Cut2n are changed and the N-channel transistors N21 to N2n are turned on by the predetermined number of transistors. After that, step S3 to step S7 are executed again. At step 7, until the output signal CYCLE2 satisfies the anticipated value, steps S8 and S3 to S7 are repeated. In this manner, the switching state of the N-channel transistors N21 to N2n that satisfy the output signal CYLCE2 at the normal temperature time is detected.

At step S7, when the output signal CYCLE2 satisfies the anticipated value, the setting state of the refresh cycle at the normal temperature time is stored (S9). For example, the state of the control signals Cut21 to Cut2n in a state in which the output signal CYCLE2 satisfies the anticipated value is stored in the LSI tester and the like.

Next, by the current measuring control circuit 18, the N-channel transistor N11 configuring the switch SW1 is turned off. As a result, the first constant current generating circuit 12 (at the high temperature side) is separated from the bias generating circuit 15 and the like (S10). Next, the control signal START inputted from the outside is put into a non-activated state (L-level) (S11). As a result, the flip-flop circuit 45 possessed by the first current-cycle converting circuit 19 is re-set, and the first current-cycle converting circuit 19 is re-set. After that, the control signal START is set to an activated state (H-level) (S12). As a result, when the re-set state of the first current-cycle converting circuit 19 is released, the first current-cycle converting circuit 19 outputs an output signal CYCLE1 that performs a cyclic operation according to the current I11 flowing to the contact point CUR1 (S13).

Figure 9:
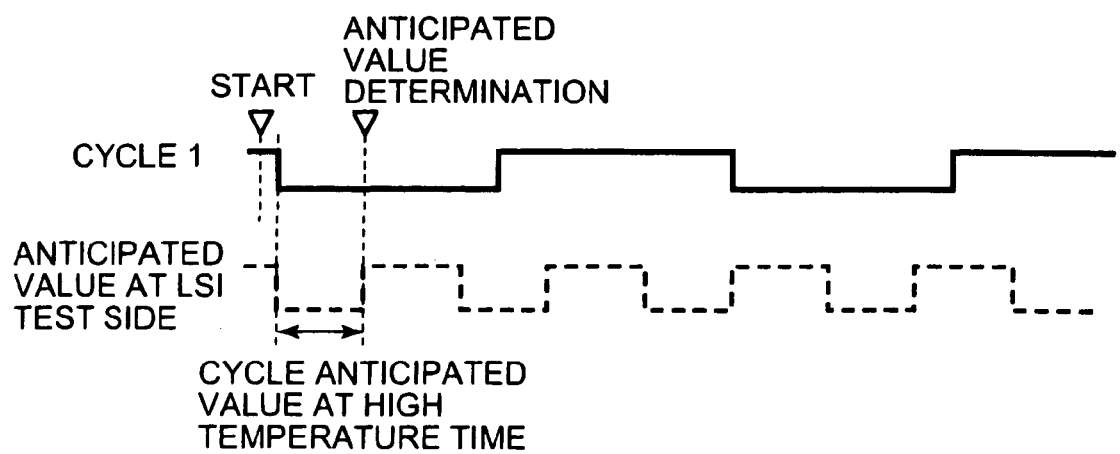
FIG. 9 shows a timing chart of an output signal CYCLE1.

Here, in FIG. 9 is shown a timing chart of the output signal CYCLE1. Incidentally, below the output signal CYCLE1 is indicated an anticipated value of the output signal CYCLE1 at the high temperature time at the LSI tester side. When the control signal START is set to the H-level, the output signal CYCLE1 changes from the H-level to the L-level, and after that, changes in potential level at the predetermined cycle. Here, in the rising up of the signal of the anticipated value in the LSI tester, the value of the output signal CYCLE1 is measured (S14). Next, by the LSI tester, the output signal CYCLE1 and the anticipated value are compared and determined (S15). When the output signal CYCLE1 does not satisfy the anticipated value of the desired range, by the refresh cycle setting circuit 14, the current adjusting switch NT11 to NT1$n$ possessed by the first constant current generating circuit 12 are switched over (S16). That is, the values of the control signals Cut11 to Cut1$n$ are changed and the N-channel transistors N11 to N1$n$ are turned on by the predetermined number of transistors. After that, step S11 to step S15 are executed again. At step 15, until the output signal CYCLE1 satisfies the anticipated value, steps S16 and S11 to S15 are repeated. In this manner, the switching state of the N-channel transistors N11 to N1$n$ that generates the output signal CYLCE1 to satisfy the anticipated value is detected.

At step S15, when the output signal CYCLE1 satisfies the anticipated value, the setting state at the high temperature time is stored (S17). For example, the state of the control signals Cut11 to Cut1$n$ in a state in which the output signal CYCLE1 satisfies the anticipated value is stored in the LSI tester and the like.

Next, at step S9, according to the setting state at the normal temperature time which is stored at step S9 and the setting state at the high temperature time which is stored at step 17, the relevant fuse 60 of the refresh cycle setting circuit 14 is shut off so as to set a refresh cycle (S18).

Here, the cycle Th at the high temperature time is set when the first constant current generating circuit 12 and the second constant current generating circuit 13 are concurrently in an activated state, and therefore, the cycle Th at the high temperature time can be represented by the following formula, where the cycle of the output signal CYCLE1 is expressed as TCYCLE1 and the output signal CYCLE2 as TCYCLCE2.

$$Th = (TCYCLE1 \times TCYCLE2)/(TCYCLE1 + TCYCLE2) \quad \text{(Formula 1)}$$

Incidentally, in FIG. 7, after measuring the cycle TCYCLE2 at the normal temperature time, the cycle Th at the high temperature time is measured. However, the cycle TCYCLE2 at the normal temperature time and the cycle TCYLCE1 at the high temperature time can be also measured in parallel.

In this manner, the first constant current generating circuit 12 and the second constant current generating circuit 13 are connected to the bias generating circuit 15 through the switches SW1 and SW2, respectively, and the currents generated by the first constant current generating circuit 12 and the second constant current generating circuit 13 are measured separately by the first current-cycle converting circuit 19 and the second current-cycle converting circuit 20, so that the refresh cycles at the normal temperature time and the high temperature time can be measured and set, respectively even in a state in which the first constant current generating circuit 12 and the second constant current generating circuit 13 concurrently generate the currents. Further, the fluctuation of the cycle TCYClE2 of the refresh timer at the normal temperature time can be measured, and this makes it possible to set the cycle TCYCLE2 to the desired anticipated value. As a result, by setting the refresh cycle to the anticipated value, the standby current of the DRAM mounted with the self-refresh control circuit 10 can be reduced.

Further, when the cyclic operation start timing of the first constant current generating circuit 12 and the second constant current generating circuit 13 is adjusted by the control signal START and the current values are measured in parallel, the current values of the first constant current generating circuit 12 and the second constant current generating circuit 13 can be measured by the same test time as before.

Further, since the measurement of the current values at the normal temperature time and the high temperature time allow the cycles TCYCLE1 and TCYCLE2 which are the same parameters to be outputted, the oscillator cycle of the ring oscillator 16 at the normal temperature time and the high temperature time can be easily calculated.

Figure 10:
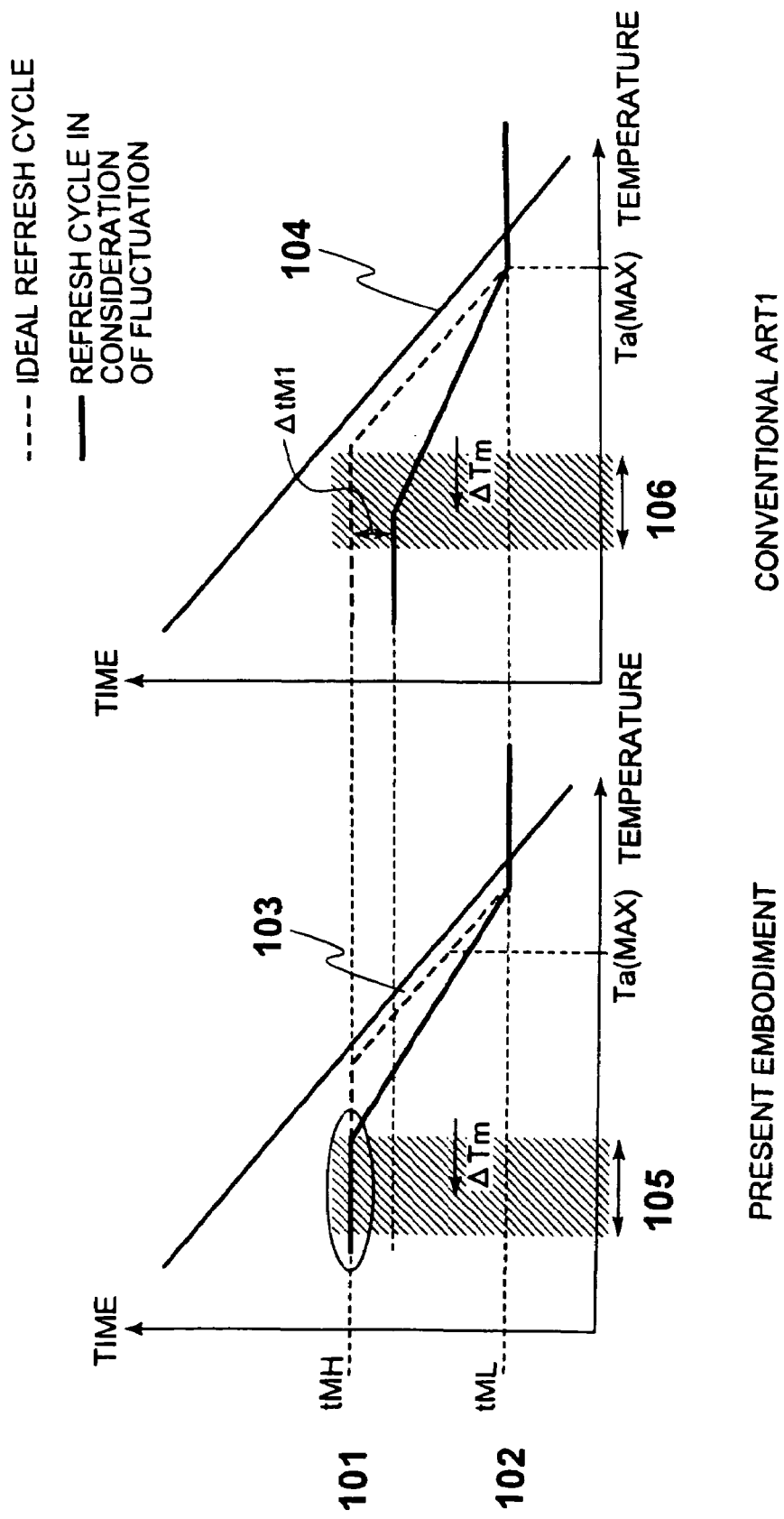
FIG. 10 is a view showing the relationship between the temperature and the refresh cycle (time) in the present embodiment and the self-refresh control circuit of a related art 1.
Figure 22:
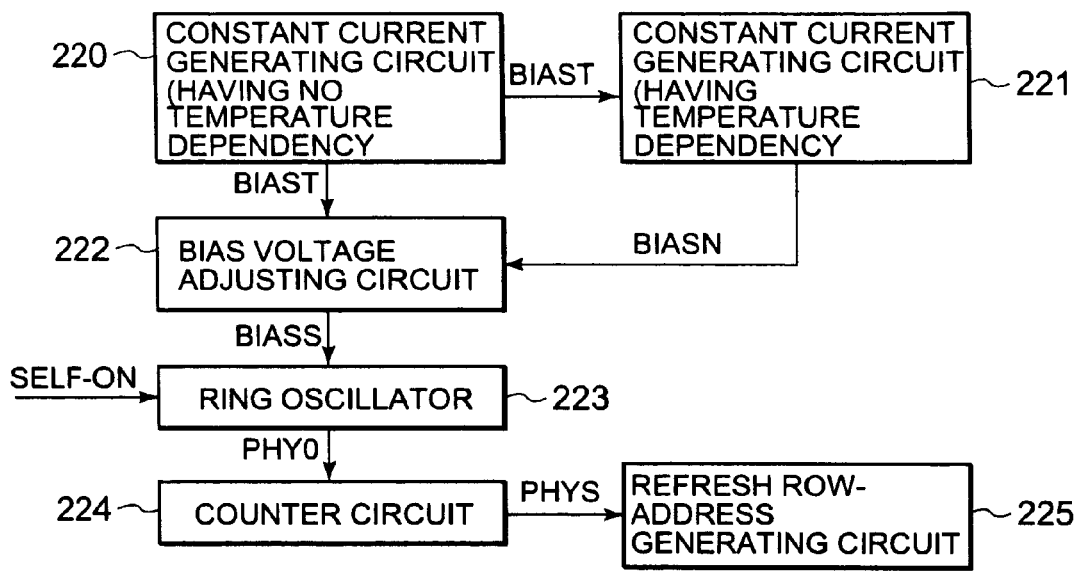
FIG. 22 is a functional block diagram showing the configuration of a conventional self-refresh control circuit disclosed in Patent Document 1.
Figure 23:
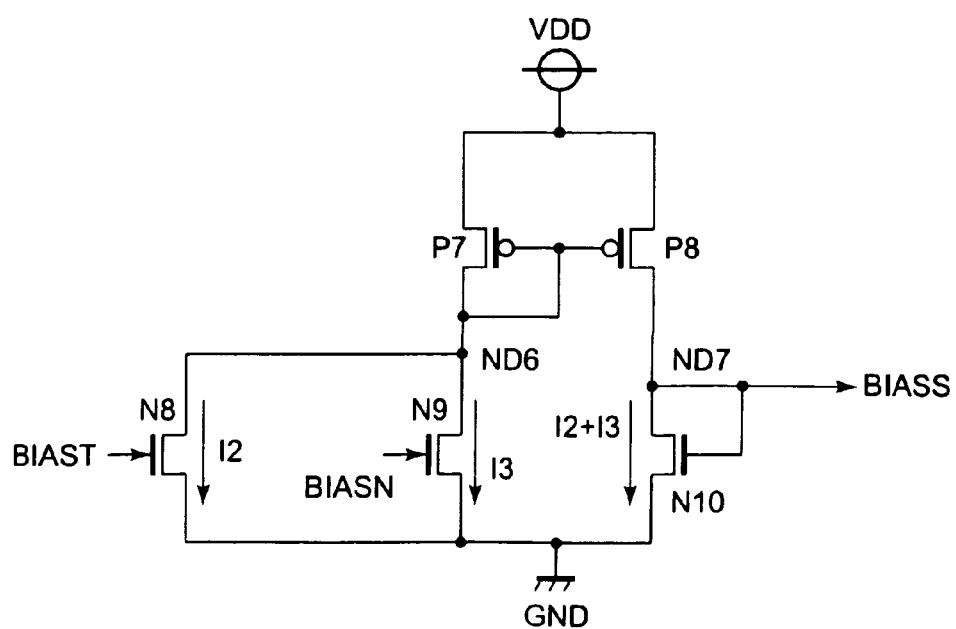
FIG. 23 shows a block diagram showing the configuration of a bias voltage adjusting circuit 222 of the conventional self-refresh control circuit disclosed in Patent Document 1.

FIG. 10 is a view showing the relationship between the temperature and the refresh cycle in the present embodiment and the self-refresh control circuit of the related art 1 shown in FIGS. 22 and 23. In the self-refresh control circuit 10 in the present embodiment, though a temperature detection fluctuation $\Delta$Tm by the temperature sensor occurs, since a variation $\Delta$tM1 of the refresh cycle by the manufacturing fluctuation can be made zero, a cycle tMH at the normal temperature time and a cycle tML of the high temperature time can be set to the vicinity of the anticipated value shown in an ideal refresh cycle. On the other hand, in the self-refresh control circuit of the related art 1, since the cycle tMH at the normal temperature time cannot be measured and adjusted, a process fluctuation $\Delta$tM1 in addition to the temperature detection fluctuation $\Delta$Tm occurs in the cycle tMH at the normal temperature time. Hence, in consideration of the fluctuation of the device, the cycle tMH at the normal temperature time must be set short. As a result, the standby current of the device is increased.

Figure 11:
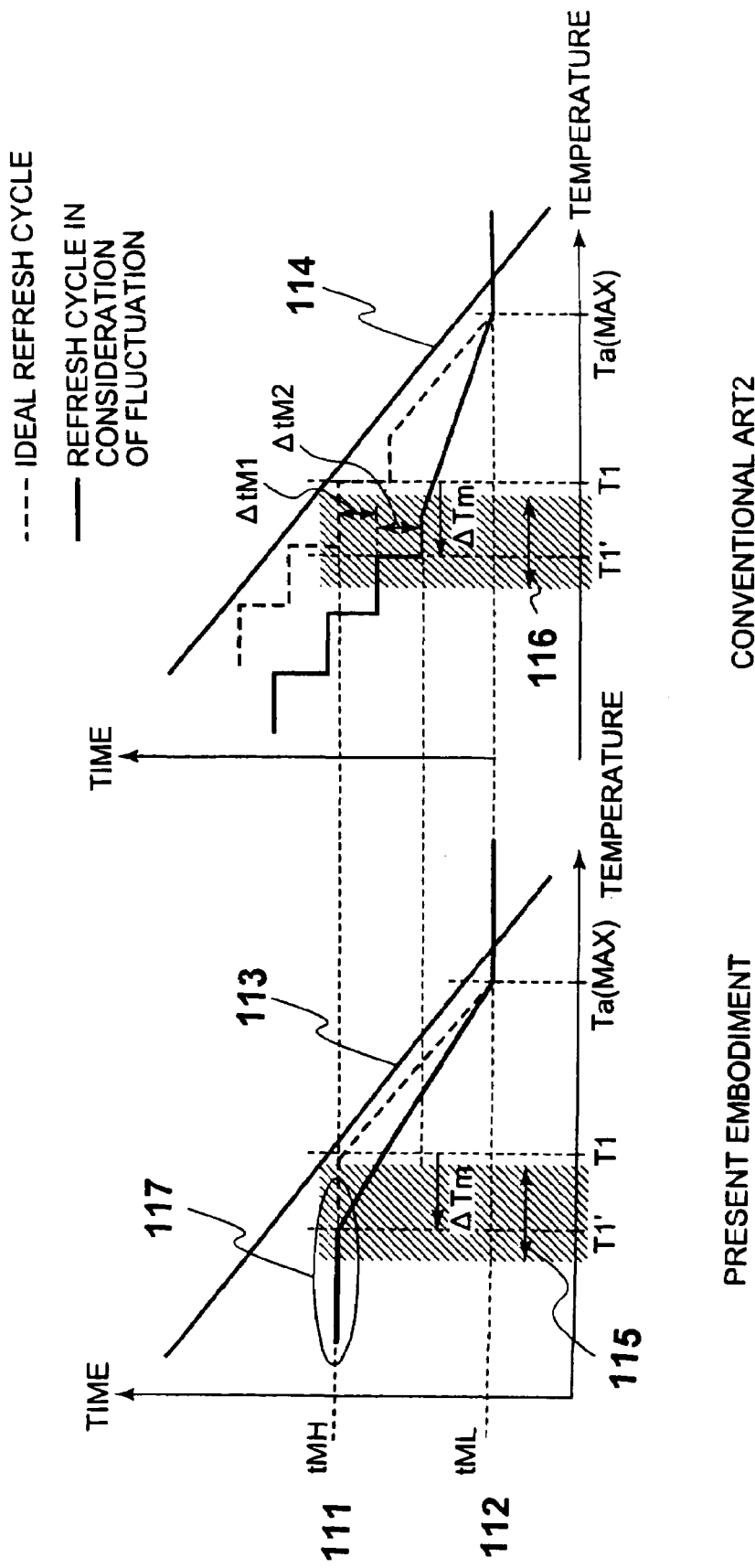
FIG. 11 is a view showing the relationship between the temperature and the refresh cycle in the present embodiment and the self-refresh control circuit of a related art 2.
Figure 24:
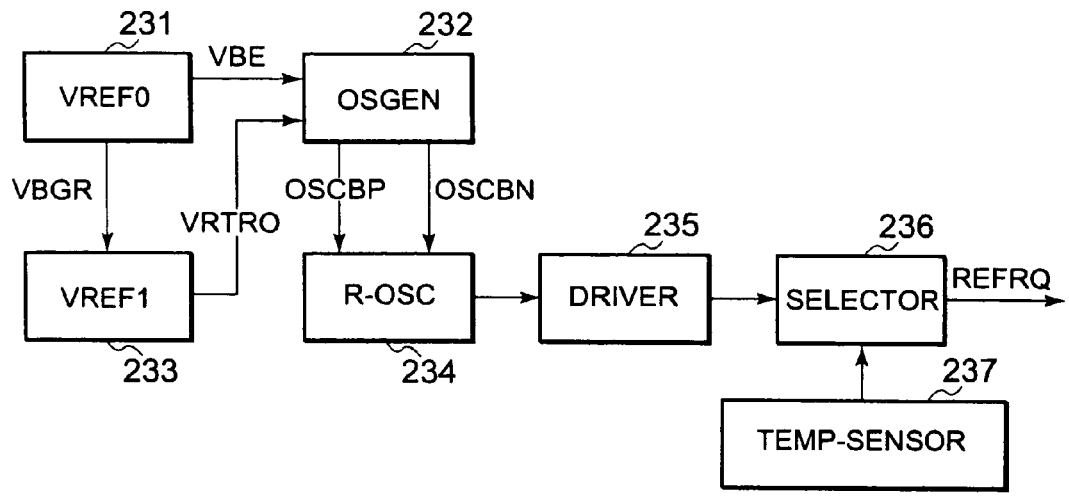
FIG. 24 is a functional block diagram showing the configuration of the conventional self-refresh control circuit disclosed in Patent Document 2.
Figure 25:
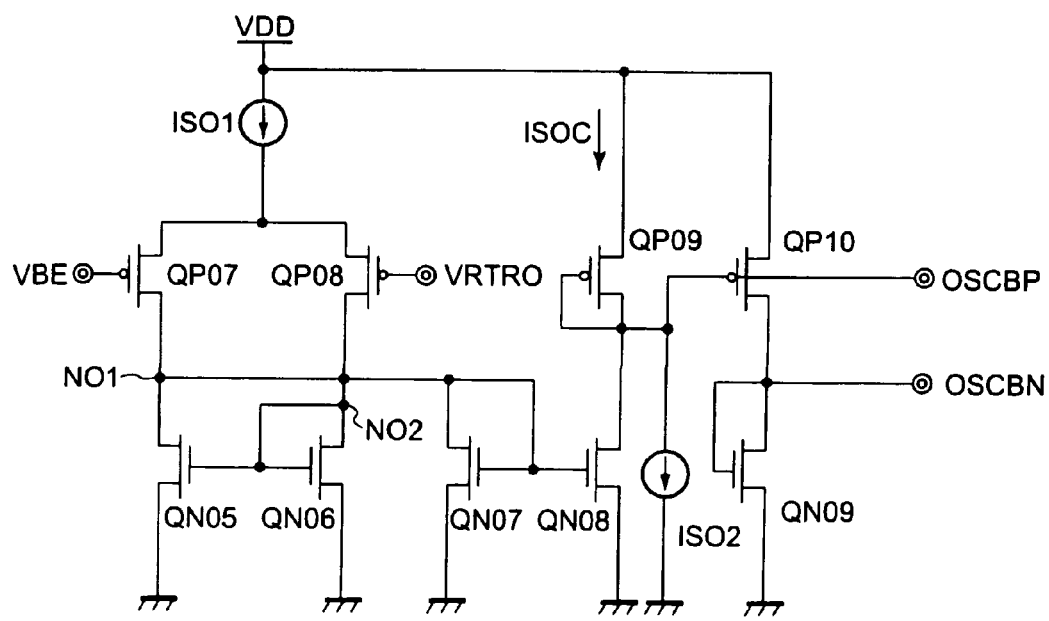
FIG. 25 is a circuit diagram showing a partial configuration of a current control bias generating circuit 232 of the conventional self-refresh control circuit disclosed in Patent Document 2.

FIG. 11 is a view showing the relationship between the temperature and the refresh cycle in the self-refresh control circuit of the related art 2 shown in FIGS. 24 and 25. In the present embodiment, the variation $\Delta$tM1 of the refresh cycle at the normal temperature time by the fluctuation can be made zero. In contrast to this, in the related art 2, since the refresh cycle is set by dividing the oscillator cycle, in addition to the product fluctuation $\Delta$tM1 at the normal temperature time, the setting fluctuation $\Delta$tM2 of the ring oscillator 16 occurs. Hence, in consideration of these fluctuations, the refresh cycle at the normal temperature time must be set short, but it is difficult to bring this refresh cycle closer to an ideal refresh cycle.

Second Embodiment

Figure 12:
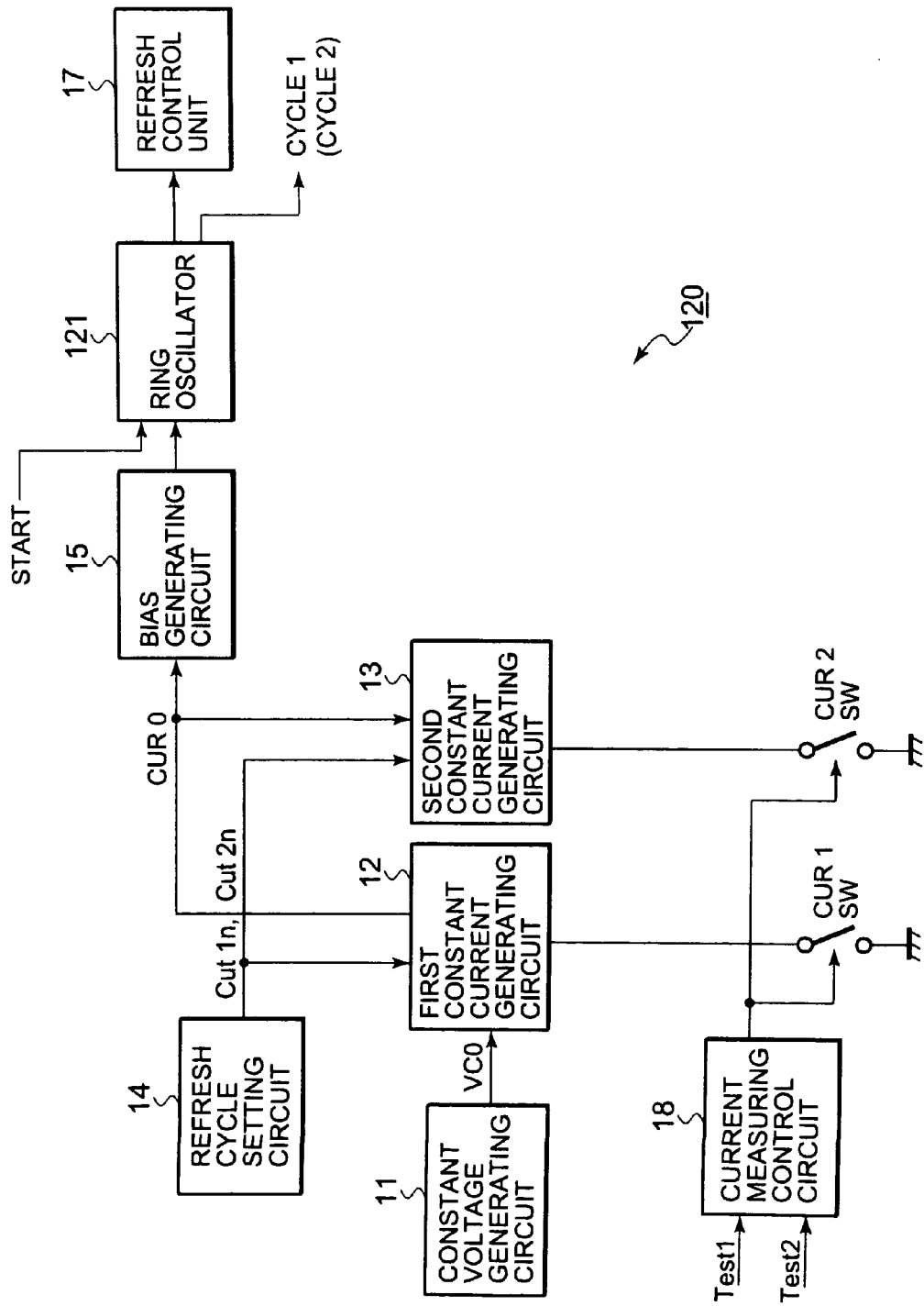
FIG. 12 is a functional block diagram showing one configuration example of a self-refresh control circuit 120 according to a second embodiment.

FIG. 12 is a functional block diagram showing one configuration example of a self-refresh control circuit 120 according to a second embodiment. The features of the second embodiment are that currents I11 and I112 generated by a first constant current generating circuit 12 and a second constant current generating circuit 13 are measured by a ring oscillator 121. In the second embodiment, a first current-cycle converting circuit 19 and a second current-cycle converting circuit 20 are not provided. Incidentally, other components are of the same configuration as the first embodiment, and therefore, the same reference numerals are attached, thereby omitting the description thereof.

Figure 13:
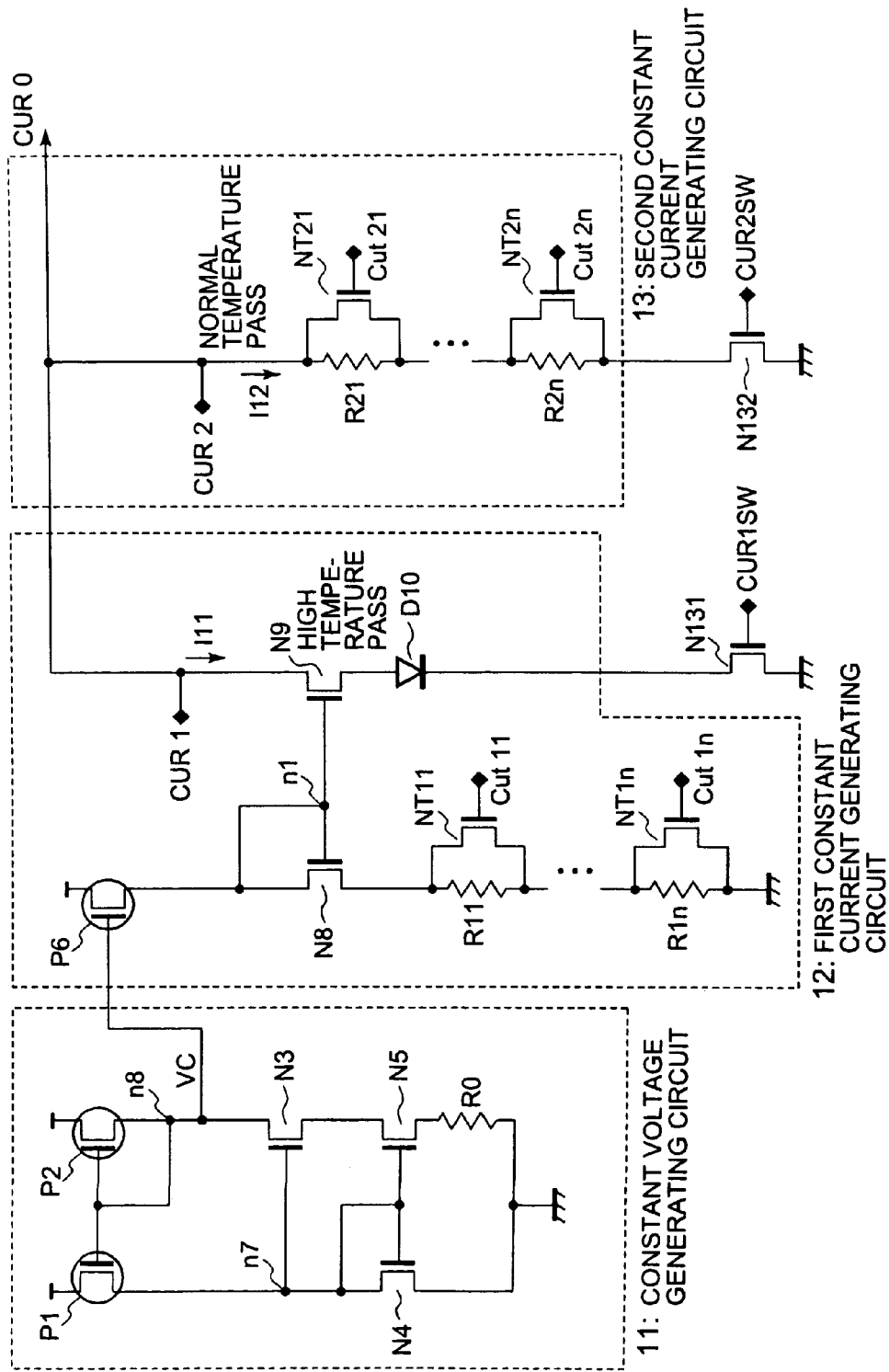
FIG. 13 is a circuit diagram showing one each specific configuration example of the constant voltage generating circuit 11, the first constant current generating circuit 12, and the second constant current generating circuit 13.

FIG. 13 is a circuit diagram showing a specific configuration example of a constant voltage generating circuit 11, a first constant current generating circuit 12 and a second constant current generating circuit 13. The difference with the first embodiment is that contact points CUR1 and CUR2 are connected to a contact point CUR0 without going through a switch. Further, a diode D10 provided for the first constant current generating circuit 12 is grounded through a N-channel transistor N131 configuring a switch SW1. Further, the contact point CUR2 is grounded through a plurality of resistors R21 to R2n connected in series and a N-channel transistor N132 configuring a switch SW2. Incidentally, the gate of the N-channel transistor N131 is inputted with a control signal CUR1SW, and the gate of the N-channel transistor N132 is inputted a control signal CUR2SW.

Figure 14:
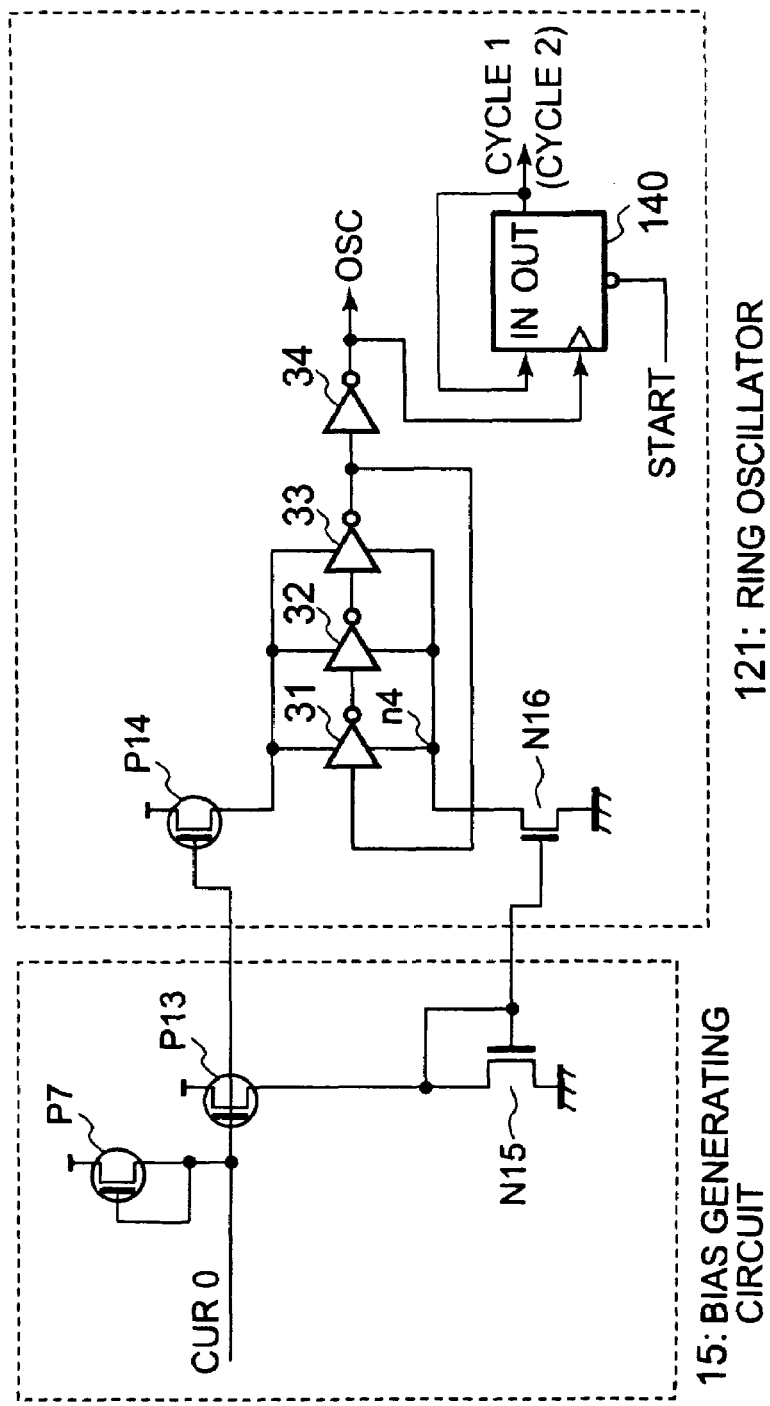
FIG. 14 is a circuit diagram showing one each configuration example of a bias generating circuit 15 and a ring oscillator 121.

FIG. 14 is a block diagram showing a configuration example of a bias generating circuit 15 and a ring oscillator 121. Incidentally, since the bias generating circuit 15 is of the same configuration as the first embodiment, the description thereof will be omitted. The ring oscillator 121 is configured to include a P-channel transistor P14, an N-channel transistor N16, inverters 31 to 33 connected in series in a ring shape, an inverter 34, and a flip-flop circuit 140. Pulse signals generated by the inverters 31 to 33 connected in series are outputted as pulse signals OSC through the inverter 34, and at the same time, are outputted as clock signals of the flip-flop circuit 140. The flip-flop circuit 140 takes the pulse signals OSC generated by the inverters 31 to 34 as clocks, and allows an output signal CYCLE1 (or output signal CYCLE2) to be fed back and inputted. Further, the flip-flop circuit 140 is configured to be controlled in an activated/non-activated state by a control voltage START.

Figure 15:
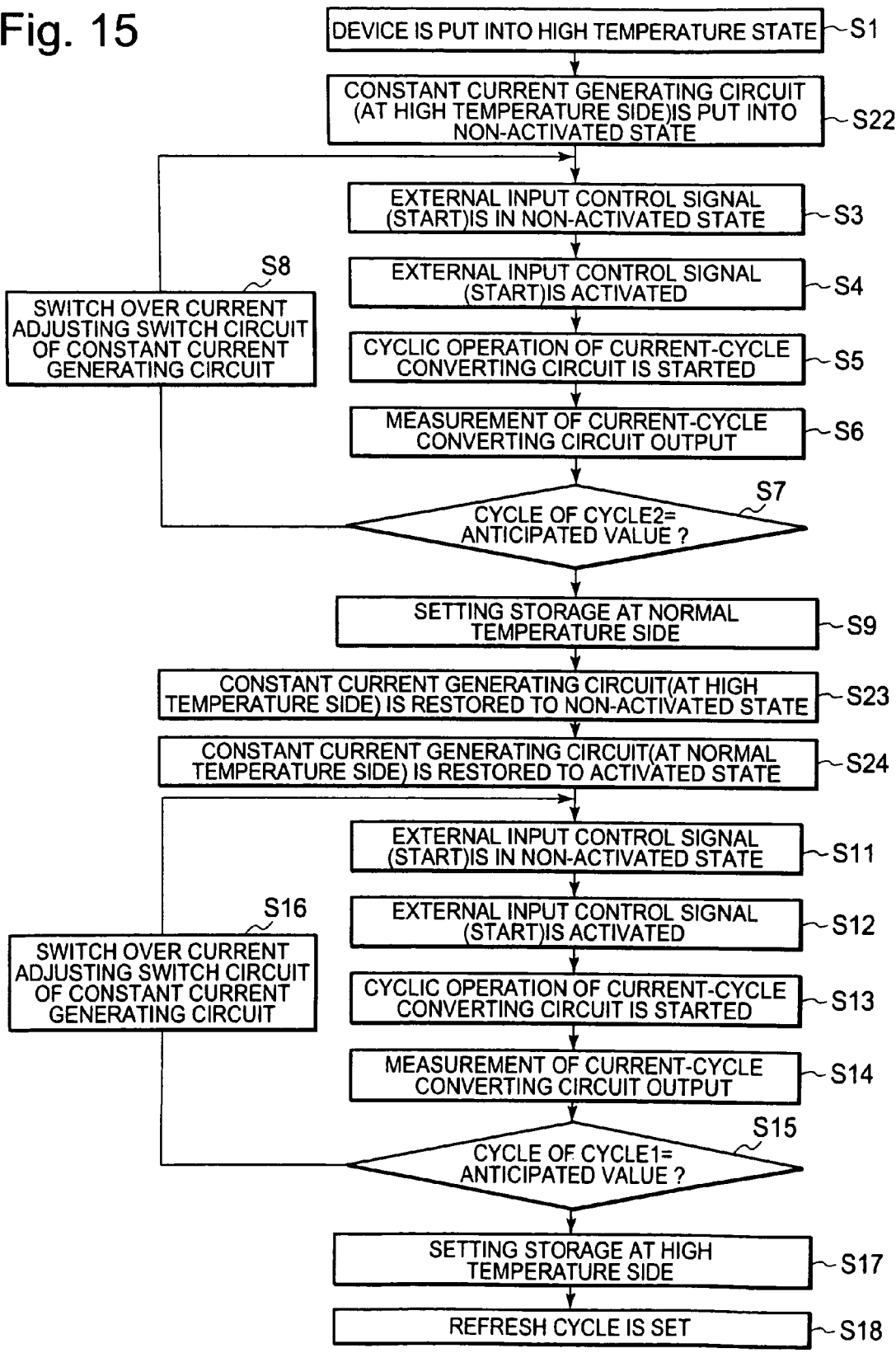
FIG. 15 is a sequence view showing a method for setting the refresh cycle of a self-refresh control circuit 120 according to the second embodiment.

Next, the operation of the self-refresh control circuit 120 configured in such manner will be described. FIG. 15 is a sequence view showing a setting method of the refresh cycle of the self-refresh control circuit 120 according to the second embodiment. In the second embodiment, at step (S1), the device is set to a high temperature state, and after that, a switch SW1 is turned off, and the first constant current generating circuit 12 is put into a non-activated state (S22). That is, where the first constant current generating circuit 12 is in a non-activated state and the second constant current generating circuit 13 is in an activated state, the setting of the refresh cycle at the normal temperature is performed. In more detail, similarly to the first embodiment, steps S3 to S8 are repeated so as to detect a cycle at the normal temperature time, and at step S9, the setting state is stored. After that, the switch SW1 is turned on, and the first constant current generating circuit 12 is put into an activates state (S23). The switch SW2 is turned off, and the second constant current generating circuit 13 is set to a non-activated state (S24). That is, where the first constant current generating circuit 12 is in an activated state and the second constant current generating circuit 13 is in a non-activates state, the setting of the refresh cycle at the high temperature times is performed. In more detail, similarly to the first embodiment, steps S11 to S16 are repeated so as to detect a cycle at the high temperature time, and after that, at step S17, the setting state is stored. That is, in the second embodiment, either one of the first constant current generating circuit 12 or the second constant current generating circuit 13 is connected to the ring oscillator 121, and the measurement of the currents I11 and I12 are performed.

In this manner, by measuring the currents of the first constant current generating circuit 12 and the second constant current generating circuit 13 by the ring oscillator 121, the first current-cycle converting circuit 19 and the second current-cycle converting circuit 20 in the first embodiment can be omitted. Even in such configuration, by switching over the switches SW1 and SW2, the advantages of the present invention can be demonstrated in that the refresh cycle at the normal temperature time can be measured and adjusted.

Third Embodiment

Figure 16:
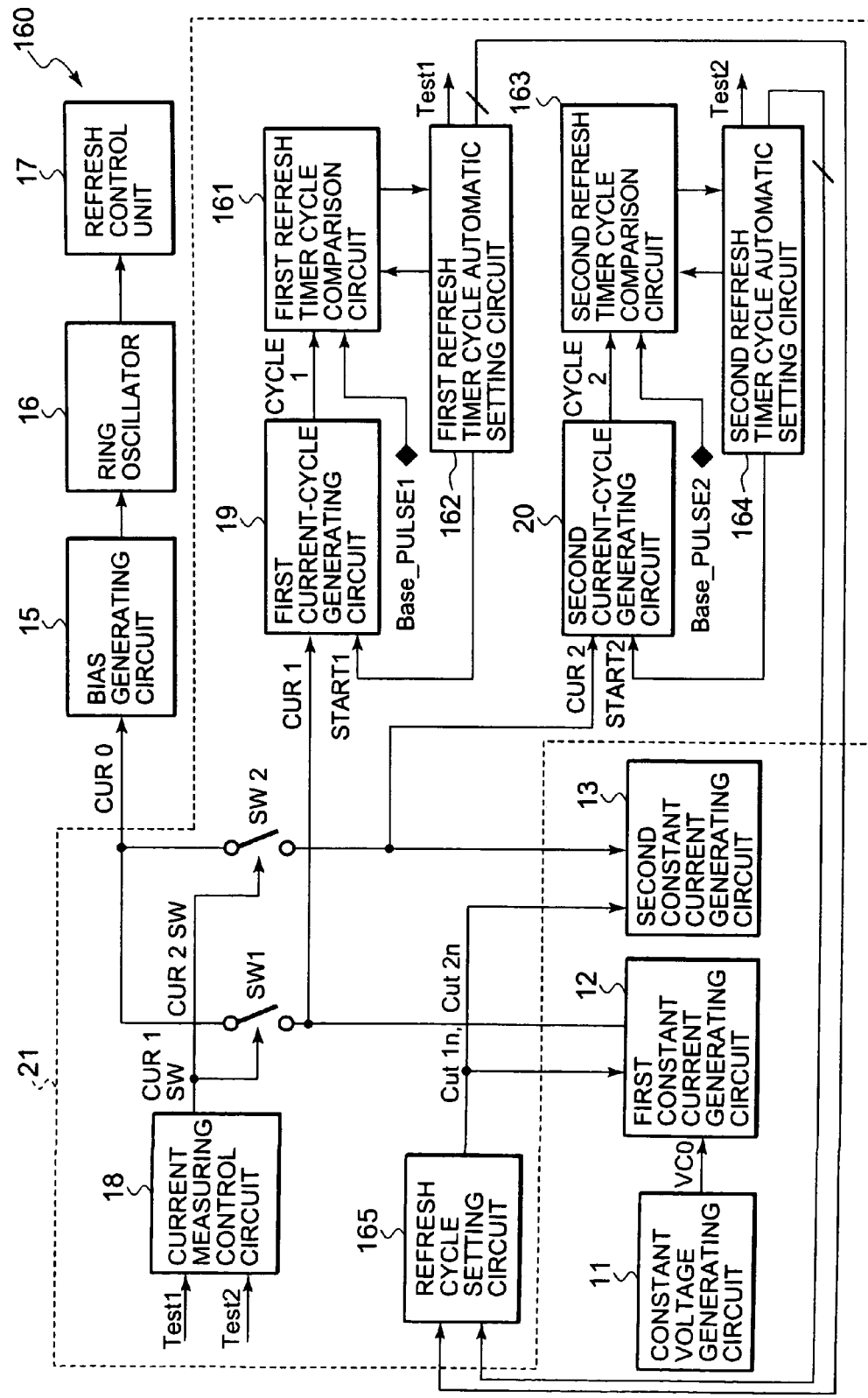
FIG. 16 is a circuit diagram showing one configuration example of a self-refresh control circuit 130 according to a third embodiment.

FIG. 16 is a circuit diagram showing one configuration example of a self-refresh control circuit 160 according to a third embodiment of the present invention. The features of the third embodiment are that, in addition to the first embodiment, a first refresh timer cycle comparison circuit 161, a first refresh timer cycle automatic setting circuit 162, a second refresh timer cycle comparison circuit 163, and a second refresh timer cycle automatic setting circuit 164 are provided. In the third embodiment, by inputting basic pulse signals Base_PULSE1, and Base_PULSE2 from the outside of the device, the setting of the refresh timer cycle is automatically performed. The basic pulse signal Base_PULSE1 is a pulse signal that operates at an anticipated refresh cycle at the high temperature time. The basic pulse Base_PULSE2 is a pulse signal that operates at the anticipated refresh cycle at the normal temperature time. Further, the self-refresh control circuit 160 has a refresh cycle setting circuit 165. Incidentally, in other configurations, since they are approximately the same as the first embodiment, the description thereof will be omitted.

The first refresh timer cycle comparison circuit 161 is configured to input the basic pulse signal Base_PULSE1 from the outside and compare the basic pulse signal with the output signal CYCLE1 of a first current-cycle converting circuit 19. The first refresh timer cycle automatic setting circuit 162 is configured to input a determination result of the first refresh timer cycle comparison circuit 161, and based on this determination result, control the refresh cycle setting circuit 165, and automatically set the cycle at the high temperature time.

The second refresh timer cycle comparison circuit 163 is configured to input the basic pulse signal Base_PULSE2 from the outside and compare the basic pulse signal with the output signal CYCLE2 of a second current-cycle converting circuit 20. The second refresh timer cycle automatic setting circuit 164 is configured to input a determination result of the second refresh timer cycle comparison circuit 163, and based on this determination result, control the refresh cycle setting circuit 165, and automatically set the cycle at the normal temperature time.

Figure 17:
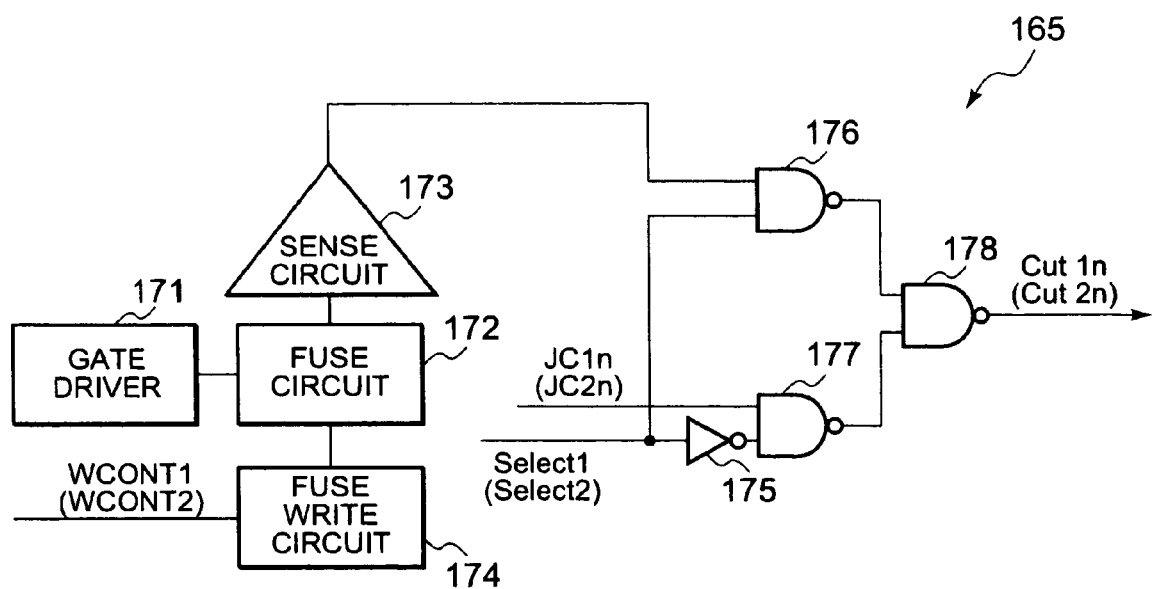
FIG. 17 is a circuit diagram showing one configuration example of a refresh cycle setting circuit 165.

FIG. 17 is a circuit diagram showing one configuration example of the refresh cycle setting circuit 165. The refresh cycle setting circuit 165 is configured to include a gate driver 171, a fuse circuit 172, a sense circuit 173, a fuse write circuit 174, an inverter 175, and NAND circuits 176 to 178. The fuse circuit 172 is a fuse circuit having an electrically programmable PROM (Programmable Read Only Memory). The gate driver 171 is configured to select optional program data from the programmed fuse circuit 172. The sense circuit 173 is configured to read the data programmed in the fuse circuit 172. The fuse write circuit 174 is configured to write data in the fuse circuit 172 according to a control signal WCONT1 (WCONT2). The NAND circuit 176 inputs an output of the sense circuit 173 at one side and inputs a control signal Select1 (Select2) at the other side. The NAND circuit 177 inputs a control signal JC1n (JC2n) on one side, and inputs a control signal Select1 (Select2) through the inverter 175 on the other side. The NAND circuit 178 inputs an output of the NAND circuit 176 on one side, and inputs an output of the NAND circuit 177 on the other side, and outputs a control signal Cut1n (Cut2n). That is, the NAND circuits 176 to 178 configure a selector circuit, and are configured to generate the control signal Cut1n (Cut2n) to control on/off of N-channel transistor N11 to 1n (N21 to 2n) which are current adjusting switches.

Figure 18:
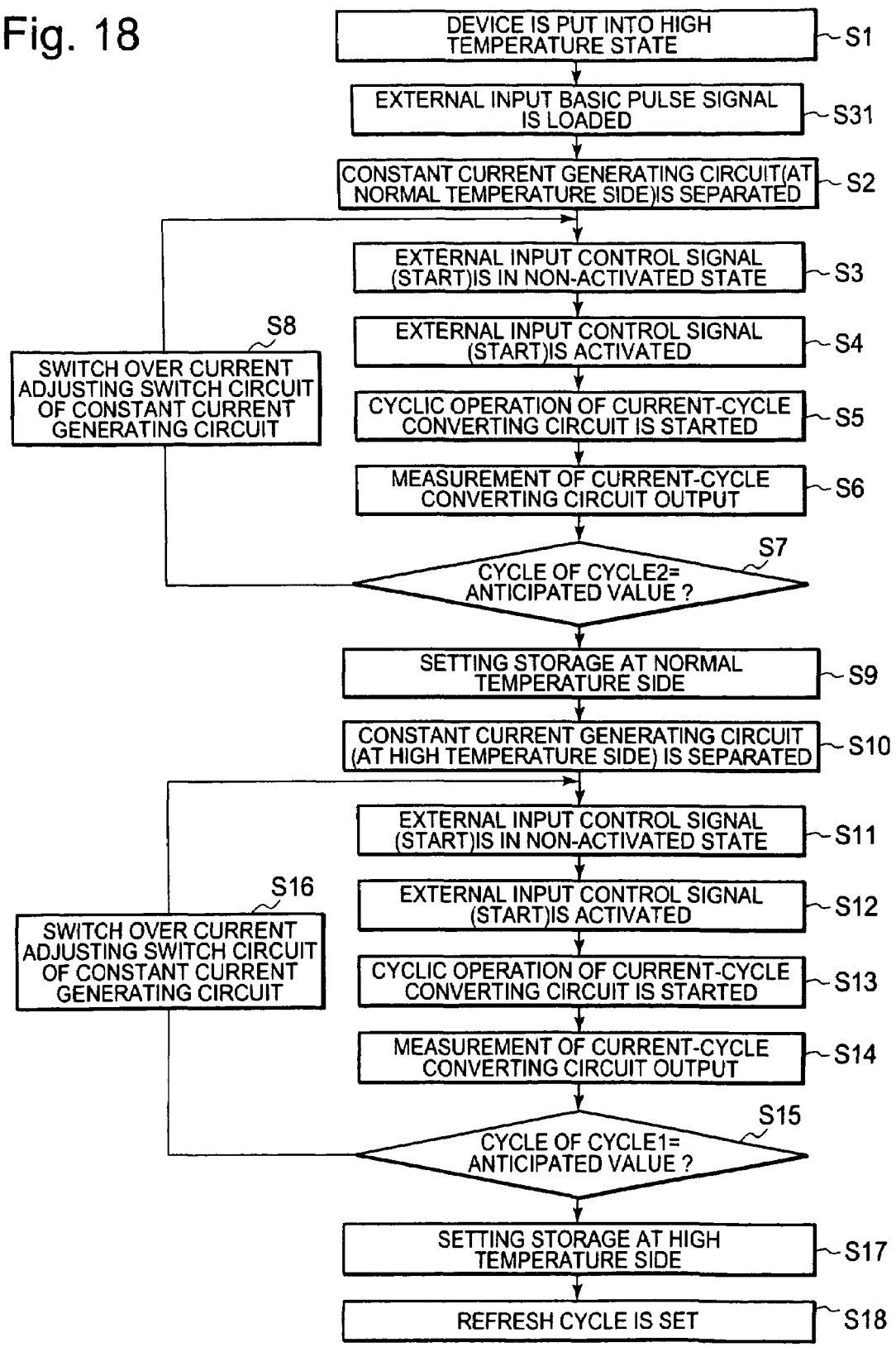
FIG. 18 is a sequence view showing a method for setting the refresh cycle of a self-refresh control circuit 120 according to the third embodiment.

Next, the operation of the self-refresh control circuit 160 configured in this manner will be described. FIG. 18 is a sequence view showing a setting method of the refresh cycle of the self-refresh control circuit 160 according to the third embodiment. First, the device is set to a high temperature state (S1). Then, the first constant current generating circuit 12 and the second constant current generating circuit 13 are concurrently put into an activated state so as to generate constant currents. Incidentally, the N-channel transistors NT11 to NT1n and NT21 to NT2n which are the current adjusting transistors possessed by the first constant current generating circuit 12 and the second constant current generating circuit 13 are all turned off, and are set to the initial state. Next, the first refresh timer cycle comparison circuit 161 is loaded with a basic pulse signal Base_PULSE1 from the outside, and the second refresh timer cycle comparison circuit 163 are loaded with a basic pulse signal Base_PULSE2 from the outside (S31). Subsequently, the setting of the refresh cycle of steps S2 to S18 described below is automatically executed in the interior of the device.

First, a switch SW2 is turned off, and the second constant current generating circuit 13 (at the normal temperature side) is separated from a bias circuit 15 and the like (S2). Next, from the second refresh timer cycle automatic setting circuit 164, the L-level control signal START2 is outputted to the second current-cycle converting circuit 20, and the second current-cycle converting circuit 20 is re-set once (S3). After that, by the second refresh timer cycle automatic setting circuit 164, the control signal START2 is set to the H-level, and the second current-cycle converting circuit 20 is activated (S4). As a result, the output signal CYCLE2 of the second current-cycle converting circuit 20 starts a cyclic operation (S5).

Next, by the second refresh timer cycle comparison circuit 163, the measurement of an output signal CYCLE2 is performed. Here, in FIG. 19 is shown a timing chart of each signal when the cycle at the normal temperature is set. When the control signal START2 is switched over from the L-level to the H-level, the output signal CYCLE2 starts a cyclic operation. The second refresh timer cycle comparison circuit 163 inputs the output signal CYCLE2 from one side, and inputs a basic pulse signal Base_PULSE2 from the other side, and measures the value of the output signal CYCLE2 when the basic pulse signal Base_PULSE2 rises from the L-level to the H-level (S6).

Next, the second refresh timer cycle comparison circuit 163 compares and determines the values of the output signal CYCLE2 and the basic pulse signal Base_PULSE2 (S7). Here, when the output signal CYCLE2 does not match the basic pulse signal Base_PULSE2, from the second refresh timer cycle automatic setting circuit 164, a control signal is outputted to the refresh cycle setting circuit 165, and the control signals Cut21 to Cut2n that control the N-channel transistors NT21 to NT2n possessed by the second constant current generating circuit 13 are switched over (S8). As a result, the predetermined N-channel transistors NT21 to NT2n are turned on, and the cycle of the output signal CYCLE2 changes. These steps S3 to S8 are repeated until the output signal CYCLE2 becomes the cycle of the anticipated value at the normal temperature time.

At step S7, when the output signal CYCLE2 satisfies the basic pulse signal Base_PULSE2, the second refresh timer cycle automatic setting circuit 164 stores an ON/OFF state of the N-channel transistors NT21 to NT2n which are the current adjusting switches possessed by the second constant current generating circuit 13 (S9). As a result, the refresh cycle at the normal temperatures side is set.

Next, the switch SW1 is turned off, and the first constant current generating circuit 12 (at the high temperature side) is separated from the bias circuit 15 and the like (S10). Next, from the first refresh timer cycle automatic setting circuit 162, control signal START1 is outputted to the first current-cycle converting circuit 19 at the L-level, and the first current-cycle converting circuit 19 is re-set once (S11). After that, by the first refresh timer cycle automatic setting circuit 162, the control signal START1 is set to the H-level, and the first current-cycle converting circuit 19 is activated (S12). As a result, the output signal CYCLE1 starts a cyclic operation (S13).

Next, by the same procedure as the normal temperature time, by the first refresh timer cycle comparison circuit 161, the measurement of an output signal CYCLE1 is performed. Here, in FIG. 20 is shown a timing chart of each signal when the refresh cycle at the high temperature time is set. When the control signal START1 is switched over from the L-level to the H-level, the output signal CYCLE1 starts a cyclic operation. The first refresh timer cycle comparison circuit 161 inputs the output signal CYCLE1 from one side, and inputs a basic pulse signal Base_PULSE1 at the higher temperature time from the other side, and measures the value of the output signal CYCLE1 when the basic pulse signal Base_PULSE1 rises from the L-level to the H-level (S14). The first refresh timer cycle comparison circuit 161 performs a determination as to whether or not the output signal CYCLE1 satisfies the basic pulse signal Base_PULSE1 at the high temperature time (S15).

When the output signal CYCLE1 does not match the basic pulse signal Base_PULSE1, from the first refresh timer cycle automatic setting circuit 162, a control signal is outputted to the refresh cycle setting circuit 165, and the control signals Cut11 to In of the N-channel transistors NT11 to NT1n which are the current adjusting switches of the first constant current generating circuit 12 are switched over (S16). As a result, the output signal CYCLE1 of the first current-cycle converting circuit 19 changes. These steps S11 to S16 are repeated until the output signal CYCLE1 becomes the cycle of the anticipated value.

At step S115, when the output signal CYCLE1 matches the basic pulse signal Base_PULSE1, the first refresh timer cycle automatic setting circuit 162 stores an ON/OFF state of the N-channel transistors NT11 to NT1n which are the current adjusting switches possessed by the first constant current generating circuit 12 (S17). As a result, the refresh cycle at the high temperatures side is set.

Next, the switching state of the current adjusting switches N11 to 1n and N21 to 2n stored both at the normal and high temperature time is stored by being electrically programmed into the fuse circuit 172 possessed by the refresh cycle setting circuit 165 (S18). As a result, the refresh cycle both at the normal and high temperature time is set.

Incidentally, in the third embodiment also, since the first constant current generating circuit 12 and the second constant current generating circuit 13 are concurrently activated at the high temperature time, similarly to the first embodiment, the cycle Th at the high temperature time becomes as the formula (I) as described above.

In this manner, the electrically programmable fuse circuit 172 is provided, and the switching state of the N-channel transistors N11 to N1n and N21 to N2n which are the current adjusting switches is automatically stored, so that the setting of the refresh cycle other than inputting the basic pulse signals Base_PULSE1 and Base_PULSE2 from the outside can be automatically performed in the interior of the self-refresh control circuit 160. As a result, a LSI tester connected to the device needs only to input the basic pulse signals Base_PULSE1 and Base_PULSE2, and therefore, the refresh cycles of a plurality of devices can be easily set. Hence, in addition to the advantages of being able to measure the refresh cycle at the normal temperature time, even when the procedure of measuring the currents of the first constant current generating circuit 12 and the second constant current generating circuit 13 increases, the refresh cycle can be set without increasing the test time.

Fourth Embodiment

Figure 21:
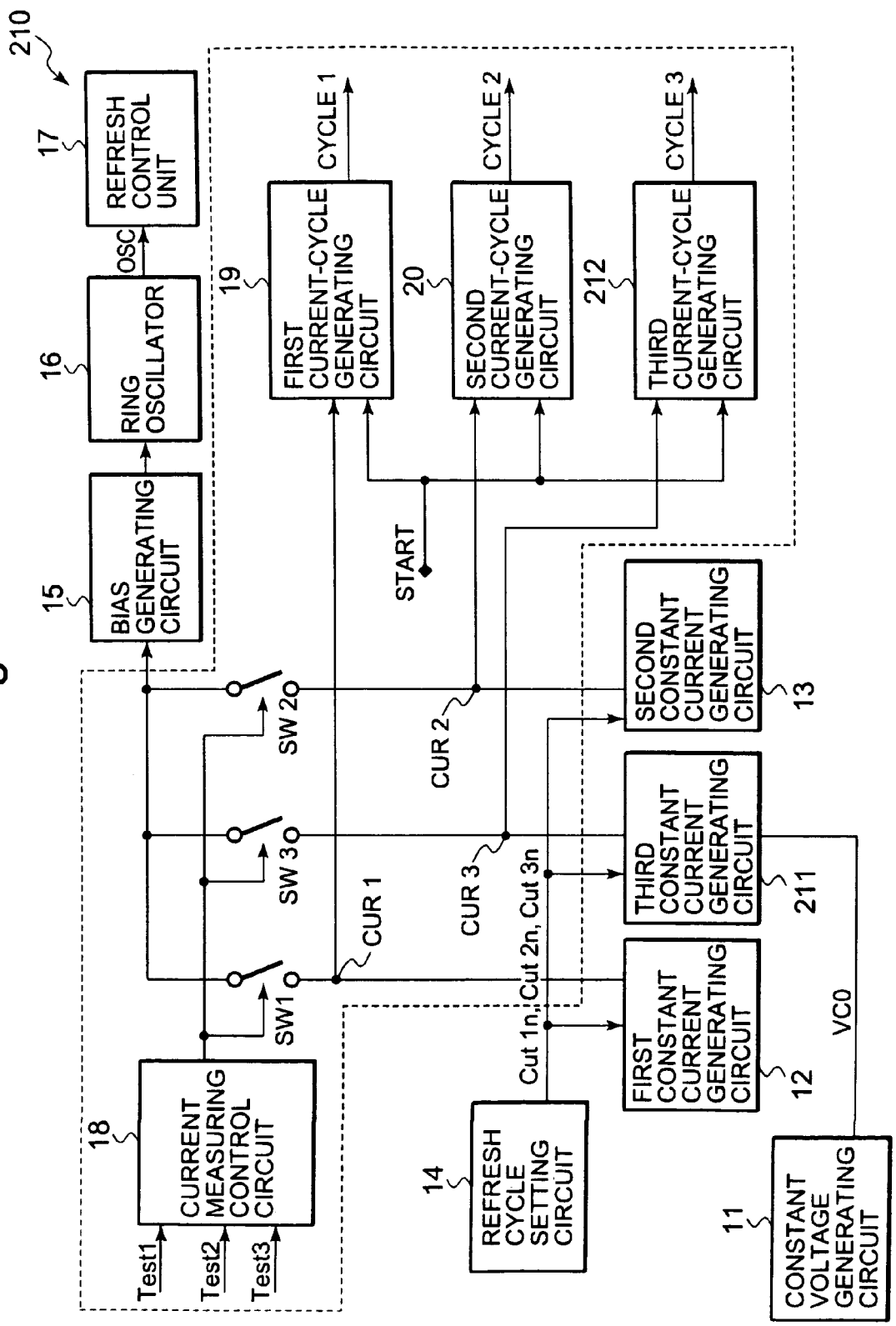
FIG. 21 is a functional block diagram showing one configuration example of a self-refresh control circuit 210 according to a fourth embodiment.

FIG. 21 is a functional block diagram showing one configuration example of a self-refresh control circuit 210 according to a fourth embodiment of the present invention. The features of the fourth embodiment are that, in addition to the first embodiment, a third constant current generating circuit 211 and a third current-cycle converting circuit 212 are provided. The third constant current generating circuit 211 is configured to inputs a reference voltage VCO from a constant voltage generating circuit 11 and output a current I31 depending on the temperature of the device to a contact point CUR3. The third constant current generating circuit 211 is connected to a bias circuit 15 through a switch SW3. The switch SW3, similarly to switches SW1 and SW2, is controlled in an ON/OFF state by a current measuring control circuit 18. The third constant current generating circuit 211 has approximately the same configuration as the first constant current generating circuit 12, and has a plurality of current adjusting switches to adjust an amount of the current such as N-channel transistors N11 to N1n possessed by the first constant current generating circuit 12. These current adjusting switches are controlled in On/OFF by a control signal Cut3n generated by a refresh cycle setting circuit 14.

The third current-cycle converting circuit 212 is configured to be connected to the contact point CUR3 and convert a current into a pulse signal having a cycle corresponding to the current flowing to the contact point CUR3 and output an output signal CYCLE3.

In the self-refresh control circuit 210 according to the fourth embodiment, by switching over the switches SW1 to SW3, the constant currents generated by the first to third constant current generating circuits 12, 13, and 121 are measured separately. In this manner, by adding the third constant current generating circuit 211 and the third current-cycle converting circuit 212, the refresh cycles at the normal and high temperature time can be further minutely set and adjusted. Incidentally, in the fourth embodiment, though one only constant current generating circuit 211 is additionally installed, the advantages of the present invention can be demonstrated in that the refresh cycle at the normal temperature time is measured even by optionally setting the number of constant current generating circuits.

So far the present Invention has been described based on embodiments. The embodiment is an indication of examples, and may be adapted by various changes, additions or subtractions as long as they do not deviate from the main purpose of the present invention. Those persons skilled in the art understand that variations to which these changes, additions or subtractions have been applied are also within the scope of the present Invention.

Further, it is noted that, Applicant's intent is to encompass equivalents of all claim elements, even if amended later during prosecution.

What is claimed is:

1. A self-refresh control circuit, comprising:
a first constant current generating circuit that generates a constant current to change depending on the temperature;
a second constant current generating circuit that generates a constant current not depending on the temperature; and
a current-cycle converting circuit which is selectively connected to the first constant current generating circuit and the second constant current generating circuit, and converts constant currents inputted from the first constant current generating circuit and the second constant current generating circuit into a test refresh cycle used for setting a refresh cycle.

2. The self-refresh control circuit according to claim 1, wherein said current-cycle converting circuit comprises:
a first current-cycle converting circuit which is selectively connected to said first constant current generating circuit and converts said constant current inputted by said first constant current generating circuit into said test refresh cycle; and
a second current-cycle converting circuit which is selectively connected to said second constant current generating circuit and converts said constant current inputted by said second constant current generating circuit into said test refresh cycle.

3. The self-refresh control circuit according to claim 1, further comprising a ring oscillator that generates a refresh cycle according to said constant current generated by said first constant current generating circuit and said constant current generated by said second constant current generating circuit, wherein said ring oscillator constitutes a portion of said current-cycle converting circuit that generates said test refresh cycle.

4. The self-refresh control circuit according to claim 1, further comprising a cycle comparison circuit that inputs a reference signal and compares said reference signal and said test refresh cycle so as to output its comparison result.

5. The self-refresh control circuit according to claim 1, further comprising at least a third constant current generating circuit generating a constant current that changes depending on the temperature or does not depend on the temperature, wherein said current-cycle converting circuit is selectively connected to said third constant current measuring circuit, and converts said constant current inputted from said third constant current generating circuit into said test refresh cycle.

6. The self-refresh control circuit according to claim 1, further comprising:
a first current value adjusting circuit that adjusts said constant current generated by said first constant current generating circuit;
a second current value adjusting circuit that adjusts said constant current generated by said second constant current generating circuit; and
a refresh cycle setting circuit that controls said first current value adjusting circuit and said second current value adjusting circuit according to said test refresh cycle.

7. The self-refresh control circuit according to claim 6, wherein said first current value adjusting circuit and said second current value adjusting circuit include a plurality of resistors connected in series and a plurality of switches connected in parallel to said each resistor, and by setting said switches to ON/OFF, to adjust said constant currents of said first constant current generating circuit and said second constant current generating circuit.

8. The self-refresh control circuit according to claim 7, wherein said refresh cycle setting circuit comprises:
   a fuse circuit that stores a control signal to set said switch to ON/OFF at the non-test time; and
   a selector circuit that selects a test control signal to set said switch to ON/OFF at the test time and said control signal stored in said fuse circuit.

9. The self-refresh control circuit according to claim 8, wherein said fuse circuit is electrically programmable.

10. A semiconductor device comprising the self-refresh control circuit according to claim 1.

11. A method of detecting a current for a self-refresh control circuit, comprising:
   during a test, activating one of first and second current generating circuits while the other of said first and second current generating circuits is not activated, to detect a first pulse outputted from a ring-oscillator, said first pulse corresponding to a first current outputted from said first current generating circuit; and
   during said test, activating the other of said first and second current generating circuits while the one of said first and second current generating circuits is not activated, to detect a second pulse outputted from said ring-oscillator, said second being corresponding to a second current outputted from said second current generating circuit.

12. The method as claimed in claim 11, wherein said first current is adjusted based on the detected first pulse and said second current is adjusted based on the detected second pulse.

13. The method as claimed in claim 12, wherein a first data and a second data are produced from said the detected first and second pulses, respectively, and said first and second data are stored in a refresh-cycle setting circuit.

14. A self-refresh control circuit, comprising:
   a first current generating circuit that includes a diode and a resistor which varies a resistance thereof based on a first data, to generate a first current to change depending on temperature;
   a second current generating circuit which includes a resistor which varies a resistance thereof based on a second data, to generate a second current not depending on the temperature; and
   a refresh cycle setting circuit which stores said first and second data to send said first and second data to said first and second current generating circuits.

15. The self-refresh control circuit as claimed in claim 14, further comprising:
   a first current cycle converting circuit which is coupled to said first current generating circuit to detect said first current; and
   a second current cycle converting circuit which is coupled to said second current generating circuit to detect said second current.

16. The self-refresh control circuit as claimed in claim 15, further comprising:
   a first switch coupled between said first current generating circuit and a bias generating circuit;
   a second switch coupled between said second current generating circuit and said bias generating circuit; and
   a current measuring control circuit to control said first and second switches.

17. The self-refresh control circuit as claimed in claim 16, further comprising:
   a first refresh timer cycle comparison circuit which compares an output from said first current cycle converting circuit with a first base pulse; and
   a second refresh timer cycle comparison circuit which compares an output from said second current cycle converting circuit with a second base pulse.

18. The self-refresh control circuit as claimed in claim 17, further comprising:
   a first refresh time cycle automatic setting circuit which, based on a result of said first refresh timer cycle comparison circuit, applies a first information corresponding to said first data to said refresh cycle setting circuit; and
   a second refresh time cycle automatic setting circuit which, based on a result of said second refresh timer cycle comparison circuit, applies a second information corresponding to said second data to said refresh cycle setting circuit.

19. The self-refresh control circuit as claimed in claim 15, further comprising:
   a first switch coupled between said first current generating circuit and a power source potential terminal;
   a second switch coupled between said second current generating circuit and said power source terminal;
   a current measuring control circuit to control said first and second switches; and
   a ring oscillator which is responsive to a current flowing from one of said first and second current generating circuits to produce a pulse signal, in response to a start signal.

20. The self-refresh control circuit as claimed in claim 16, further comprising:
   a third current generating circuit which include a resistor which varies a resistance thereof based on a third data to generate a second current.

* * * * *